United States Patent
Brooks

(10) Patent No.: US 10,466,277 B1
(45) Date of Patent: Nov. 5, 2019

(54) SCALED AND PRECISE POWER CONDUCTOR AND CURRENT MONITORING

(71) Applicant: John Brooks, Wahoo, NE (US)

(72) Inventor: John Brooks, Wahoo, NE (US)

(*) Notice: Subject to any disclaimer, the term of this patent is extended or adjusted under 35 U.S.C. 154(b) by 116 days.

(21) Appl. No.: 15/886,719

(22) Filed: Feb. 1, 2018

(51) Int. Cl.
G01R 15/20 (2006.01)
G01R 19/00 (2006.01)
G01R 19/32 (2006.01)

(52) U.S. Cl.
CPC ....... G01R 15/202 (2013.01); G01R 19/0092 (2013.01); G01R 19/32 (2013.01)

(58) Field of Classification Search
CPC ... G01R 15/202; G01R 19/32; G01R 19/0092
USPC .................. 324/105, 76.69, 76.11
See application file for complete search history.

(56) References Cited

U.S. PATENT DOCUMENTS

| | | | |
|---|---|---|---|
| 6,617,972 B2* | 9/2003 | Takarada | G08B 21/0484 324/538 |
| 7,930,118 B2 | 4/2011 | Vinden et al. | |
| 8,384,249 B2 | 2/2013 | Elberbaum | |
| 8,433,530 B2 | 4/2013 | Shimada et al. | |
| 8,450,995 B2 | 5/2013 | Wagner | |
| 8,779,729 B2* | 7/2014 | Shiraishi | G06F 1/3212 320/155 |
| 8,805,628 B2 | 8/2014 | Patel et al. | |
| 8,843,334 B2 | 9/2014 | Donaldson et al. | |
| 8,930,152 B2 | 1/2015 | Patel et al. | |
| 2006/0007016 A1 | 1/2006 | Borkowski et al. | |
| 2010/0070217 A1 | 3/2010 | Shimada et al. | |
| 2010/0167659 A1 | 7/2010 | Wagner | |
| 2011/0074382 A1 | 3/2011 | Patel | |
| 2011/0153246 A1 | 6/2011 | Donaldson et al. | |
| 2011/0202194 A1 | 8/2011 | Kobraei et al. | |
| 2012/0068692 A1 | 3/2012 | Patel et al. | |
| 2012/0098518 A1* | 4/2012 | Unagami | G01R 22/066 324/74 |
| 2012/0262006 A1 | 10/2012 | Elberbaum | |

FOREIGN PATENT DOCUMENTS

GB 2471536 A 1/2011

OTHER PUBLICATIONS

Allegro Microsystems LLC, "Automotive-Grade, Galvanically Isolated Current Sensor IC With Common-Mode Field Rejection in a Small-Footprint SOIC8 Package", Aug. 3, 2017, 27 pages, ACS724-DS, Rev. 6., Worcester, Massachusetts.

(Continued)

Primary Examiner — Giovanni Astacio-Oquendo
(74) Attorney, Agent, or Firm — Suiter Swantz pc llo

(57) ABSTRACT

A precise electrical current monitor having individual, communicatively coupled sensors providing separate readings to a processor. The monitor uses efficient switching logic requiring a single input to iteratively receive individual sensor readings from each sensor of the monitoring system. The monitor compensates for temperature effects on the sensor readings. The monitoring system is scalable depending on loads, circuits, appliances, or conductors through which the current being monitored flows. The monitoring system provides a continuous stream of data, including backed-up data when communications are down.

20 Claims, 14 Drawing Sheets

(56) References Cited

OTHER PUBLICATIONS

Allegro Microsystems LLC, "High-Accuracy, Hall-Effect-Based Current Sensor IC with Common-Mode Field Rejection in High-Isolation SOIC16 Package", Nov. 27, 2017, 20 pages, ACS724KMA-DS, Rev. 5, Worcester, Massachusetts.
Texas Instruments, "High-Speed CMOS Logic 16-Channel Analog Multiplexer/Demultiplexer", 2017, pp. 1-7, Dallas, Texas, accessed online Jan. 23, 2017: http://www.ti.com/lit/ds/symlink/cd74hc4067.pdf.
Recom, "Powerline AC/DC-Converter", 2014, 2 pages, CD74HC4067, accessed online Jan. 23, 2017: https://www.recom-power.com/pdf/Powerline-AC-DC/RAC01_02-SC.pdf.

\* cited by examiner

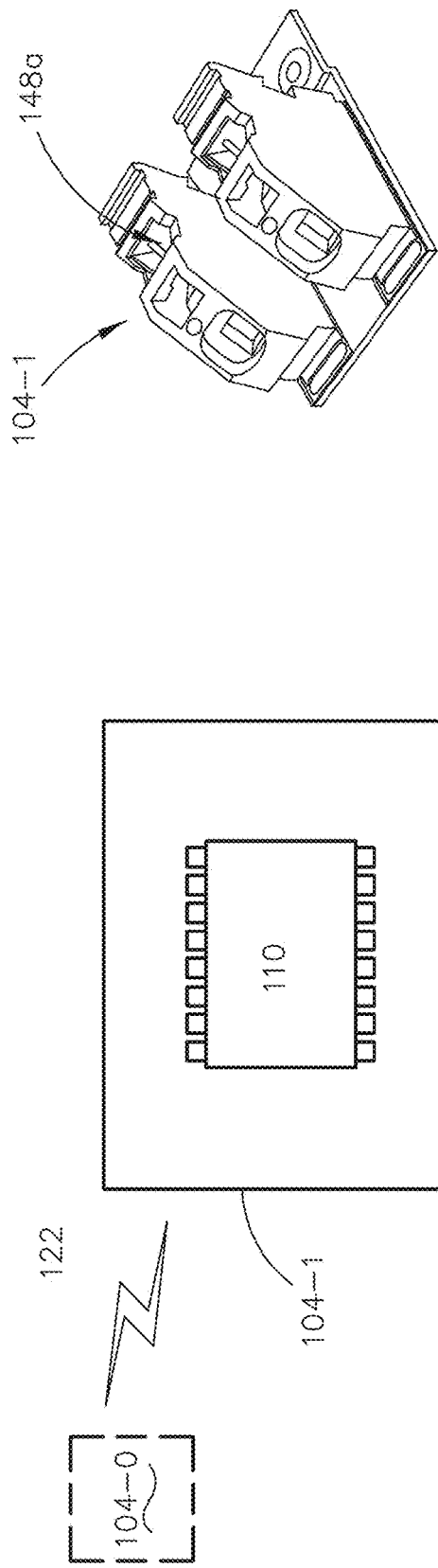
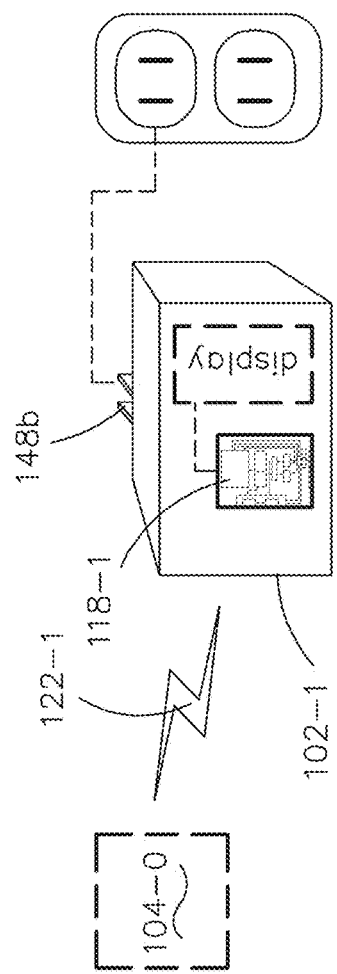
FIG. 8A
FIG. 8B
FIG. 9

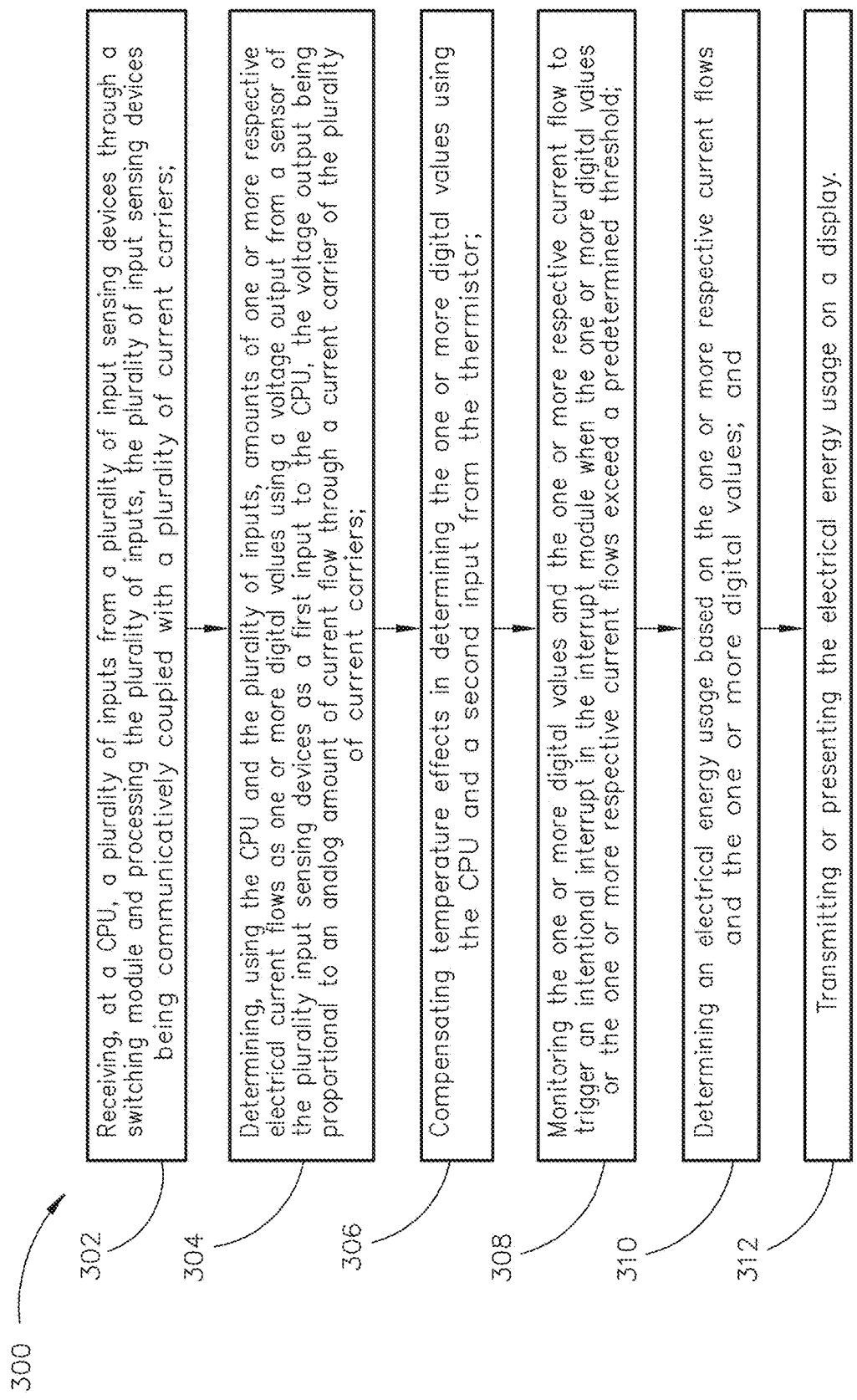

SCALED AND PRECISE POWER CONDUCTOR AND CURRENT MONITORING

BACKGROUND

Electricity monitoring through utility providers enables more efficient usage. As customers receive monthly or annual electricity usage rates, trends may be determined, costs anticipated, and assets allocated. If the utility provider gives inaccurate or imprecise information, the trends, costs, and allocated assets are proportionally impacted. Energy-efficiency may also be detrimentally impacted as consumers inaccurately or imprecisely determine how or where energy usage may be curbed and power saved.

Switches, electrical outlets, circuit breakers, and similar electrical connections contain an electrical conductor through which an electrical current flows. An interruption in the current flowing to an appliance, a light switch, or other electrical load may have several effects depending on how, where, when, and why it occurs. For example, if the interruption is due to an overloading current flow, the interruption may protect wires, electrical feeds, and the appliance from short circuiting or other damaging effects. If the interruption occurs intentionally when appliances or lights are not in use, energy usage may be minimized and power saved. However, some buildings have multiple circuits, multiple rooms, and various current loads in unusual places. In these circumstances, although an intentional interrupt may be desired in order to save power when the circuits, rooms, or loads are no longer in use, the interrupt may never occur because the current flow may never be detected. By way of another example, if long lengths of conduits or electrical feeds are used and the interrupt occurs unexpectedly and in an unknown length of conduit or feed, removing the interrupt and restoring current flow may be time-consuming and expensive, despite the use of conventional power monitoring systems. Further, if unexpected or unintentional interrupts occur in hospitals or other buildings requiring a continuous power supply, then the costs and effects associated with finding and repairing the interrupt become more severe.

Although some electricity meters may be classified as 'smart meters' they may utilize only a single sensor, such as an induction coil sensor. Further, these 'smart meters' are often limited to monitoring at the electrical main, and are usually analog meters.

Data mining, data pattern extraction, machine learning, and other forms of artificial intelligence (AI) summarize and present physical, analog interactions in a digital medium. The digital medium is often in communication with a user interface to enable continuous, short-term, or long-term access to the data. The digital medium further enables networked access and control of the data.

Machine learning, automation, and autonomous systems ensure accuracy, while reducing operator workload. However, although a system may be fully automated, if a user is required to be physically present to operate the system or receive output therefrom, its value greatly diminishes.

SUMMARY

Therefore, the inventive concepts disclosed herein are provided to obtain more granular, secure, and otherwise improved electricity, current, switch, outlet, circuit, and conductor monitoring systems, methods, and/or apparatuses.

In one aspect, the inventive concepts disclosed herein are directed to a current monitor system. The current monitor system may include multiple input sensing devices coupled individually to multiple current carriers to monitor one or more respective current flows of one or more of the multiple current carriers. The system may include a first input sensing device of the multiple input sensing devices, where the first input sensing devices is a Hall Effect sensor. The system may include a second input sensing device, a third input sensing device, and a fourth input sensing device where the second input sensing device is a thermistor, the third input sensing device is an interrupt module, and the fourth input sensing device is a switching module. The system may include a first processor communicatively coupled with the multiple input sensing devices to continuously receive multiple inputs. The system may include a memory coupled to the first processor with executable instructions thereon, which are configured to perform steps. The steps may include receiving the multiple inputs from the multiple input sensing devices, where at least a first input from the Hall Effect sensor is through the switching module; determining, using the multiple inputs, the one or more respective current flows as one or more digital values using a voltage output from the Hall Effect sensor as the first input to the first processor, the voltage output being proportional to an analog amount of current flow through the one or more of the plurality of current carriers; compensating temperature effects in determining the one or more digital values using a second input from the thermistor; triggering an intentional interrupt in the interrupt module when the one or more respective current flows or the one or more digital values exceed a predetermined threshold; determining an electrical energy usage based on the one or more respective current flows and the one or more digital values; and presenting, using a second processor and a display, a user interpretation based on the electrical energy usage.

In a further aspect, the inventive concepts are directed to a current monitor apparatus. The current monitor apparatus may include multiple input sensing devices attached to a first current carrier of a multiple current carriers to monitor respective current flows of the multiple current carriers. A first input sensing device of the multiple input sensing devices may be a Hall Effect sensor. A second input sensing device may be a thermistor, a third input sensing device may be an interrupt module, and a fourth input sensing device may be a switching module. The apparatus may include a central processing unit (CPU) communicatively coupled with the multiple input sensing devices to continuously receive multiple inputs. The apparatus may include a memory coupled to the CPU with executable instructions configured to perform steps. The steps may include receiving at least a portion of the multiple inputs from the multiple input sensing devices through the switching module and processing the multiple inputs, wherein the portion of the multiple inputs received may be associated with the Hall Effect sensor; determining, using the CPU and the multiple inputs, the one or more respective current flows as one or more digital values using a voltage output from the Hall Effect sensor as a first input to the CPU, the voltage output being proportional to an analog amount of current flow through the first current carrier or a second current carrier of the multiple current carriers; compensating temperature effects in determining the one or more digital values using a second input from the thermistor; triggering an intentional interrupt in the interrupt module when the one or more respective current flows or the one or more digital values exceed a predetermined threshold; determining an electrical energy usage based on the one or more digital values; and displaying the electrical energy usage or transmitting the electrical energy usage for presentation on a display.

In a further aspect, the inventive concepts are directed to a method of current monitoring. The method may include receiving, at a central processing unit (CPU), multiple inputs respectively from multiple input sensing devices and processing the multiple inputs, where the multiple input sensing devices may include at least a Hall Effect sensor, a thermistor, an interrupt module, and a switching module. The multiple input sensing devices may be communicatively coupled with multiple current carriers, wherein at least the input from the Hall Effect sensor to the CPU is through the switching module. The method may include determining, using the CPU and the multiple inputs, amounts of one or more respective electrical current flows as one or more digital values using a voltage output from the Hall Effect sensor as a first input to the CPU, the voltage output being proportional to an analog amount of current flow through a current carrier of the multiple current carriers. The method may include compensating temperature effects in determining the one or more digital values using the CPU and a second input from the thermistor. The method may include monitoring the one or more digital values and the one or more respective current flows to trigger an intentional interrupt in the interrupt module when the one or more digital values or the one or more respective current flows exceed a predetermined threshold. The method may include determining an electrical energy usage based on the one or more respective current flows and the one or more digital values, and transmitting or presenting the electrical energy usage on a display.

In a further aspect, the inventive concepts are directed to a power conductor and current monitoring system. The system may include a current monitoring apparatus having a first one or more sensors configured to interface with a power conductor to receive and monitor a current flow from the power conductor. The system may include at least one second sensor configured to provide a baseline reading and a switch having switching logic for switching between data transfers from the first one or more sensors and from the at least one second sensor. The system may include a memory with instructions thereon and a processor such as a central processing unit (CPU). The CPU may be in communication with the memory and may be configured to access the instructions to perform one or more steps. The one or more steps may include: receiving a first data transfer from the first one or more sensors as a first input that is proportional to an amount of the current flow through the power conductor; receiving a second data transfer comprising the baseline reading from the at least one second sensor as a second input; determining the amount of current flow based on a difference between a first sensor reading included in the first data transfer and the baseline reading; and presenting the amount of current flow or a semantic interpretation based on the amount of current flow on a display.

In a further aspect, the inventive concepts are directed to an electrical current monitoring apparatus. The apparatus may include multiple input sensing devices communicatively coupled with a processor and a memory to monitor one or more respective current flows through individual current carriers of multiple current carriers. The multiple input sensing devices may include at least one Hall Effect sensor. The memory of the apparatus may have executable instructions thereon for performing steps. The steps may include receiving multiple inputs from the multiple input sensing devices through the switching module and processing the multiple inputs; determining, using the multiple inputs, the one or more respective current flows as one or more digital amounts of current flow using a voltage output from the at least one Hall Effect sensor as a first input to the processor, the voltage output being proportional to an analog amount of current flow through a current carrier of the multiple current carriers; compensating temperature effects in determining the one or more digital amounts of current flow using a second input from the thermistor; triggering an intentional interrupt in the interrupt module when the one or more respective current flows or the one or more digital amounts of current flow exceed a predetermined threshold; determining a user interpretation based on the one or more digital amounts of current flow; and displaying the user interpretation, or transmitting the user interpretation for presentation on a display.

In a further aspect, the inventive concepts are directed to a power conductor and current monitoring system. This system may include a daughterboard communicatively coupled with a motherboard to provide a sensor reading proportional to an amount of current flow, and a server communicatively coupled with the motherboard to receive monitoring data from the motherboard. Within the system, the motherboard may have a CPU and a switch with switching logic thereon. The switching logic may be configured for communicatively coupling a single channel of multiple channels with the CPU upon receipt of a single input from among multiple inputs, whereby the processor may be configured to separately and individually communicate with each channel of the multiple channels upon iterative receipt of each single input of the multiple inputs. This system configuration or communicative coupling may enable the switch, the CPU, and the plurality of inputs are to precisely monitor electrical power and current flowing through a conductor.

In a further aspect, the inventive concepts are directed to a method for precise conductor and current monitoring. The method may include receiving a first one or more inputs from a first monitoring device; determining a logic configuration based on the first one or more inputs received for a multi-layer switch; sequentially receiving a second one or more inputs from one or more second monitoring devices communicatively coupled with the first monitoring device, either the first monitoring device or the one or more second monitoring devices coupled with sensors, the sensors including a reference or baseline sensor; providing a packet of monitoring data to a processor for data processing, analysis, and compilation; and presenting the monitoring data to a user on a display, wherein at least one of the sequentially receiving and the presenting uses a hyper text transfer protocol (HTTP).

In a further aspect, the inventive concepts disclosed herein are directed to an electrical current monitoring system. The system may include multiple, individual monitoring apparatuses configured to continuously monitor a first amount of current flow to a circuit and a second amount of current flow to at least one of an appliance and an electrical load. The system may include a central processing unit (CPU) in communication with the multiple, individual monitoring apparatuses to correlate the first amount of current flow with at least one of a status of the circuit, an electrical capacity of the circuit, a type or name associated with the circuit, and a type of user associated with the circuit, and to correlate the second amount of current flow with at least one of a type or name associated with the appliance, a remaining life span of the appliance, a replacement date of the appliance, an operational capacity of the appliance, a status of the electrical load, a balance of the electrical load, and a type or name of one or more devices associated with the electrical load. The system may include a switch communicatively coupled with the central processing unit and the multiple individual monitoring apparatuses to provide a separate communication channel and a separate time for each monitoring apparatus of the multiple, individual monitoring apparatuses to provide monitoring data to the CPU. The system may include a thermistor configured for providing a temperature associated with the monitoring data of each monitoring apparatus, wherein the CPU is further configured to compensate one or more effects of the temperature associated with the monitoring data of each monitoring apparatus to more precisely determine the first and second amounts of current flow.

In a further aspect, the inventive concepts disclosed herein are directed to a method for monitoring electrical current flow. The method may include receiving, at a central processing unit (CPU), a first input from a first monitoring apparatus of multiple individual monitoring apparatuses configured to continuously monitor a first amount of current flow to a circuit and a second amount of current flow to at least one of an appliance and an electrical load. The method may include correlating the first input respectively with the first amount of current flow or the second amount of current flow. The method may include correlating the first amount of current flow with a first user interpretation. The method may include correlating the second amount of current flow with the first user interpretation or a second user interpretation. The method may include receiving a single-bit input at a switch to communicatively couple the CPU with a second monitoring apparatus of the multiple individual monitoring apparatuses and to receive a second input. The method may include compensating one or more temperature effects associated with the first input or the second input to more precisely determine the first and second amounts of current flow.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings:

FIGS. 8A and 8B are embodiments of a daughterboard unit, according to inventive concepts disclosed herein;

FIG. 9 is an embodiment of a remote monitoring apparatus, according to the inventive concepts disclosed herein;

FIG. 15 is an embodiment of a method for scaled and precise current and conductor monitoring, according to the inventive concepts disclosed herein.

DETAILED DESCRIPTION OF EXEMPLARY EMBODIMENTS

Figure 1:
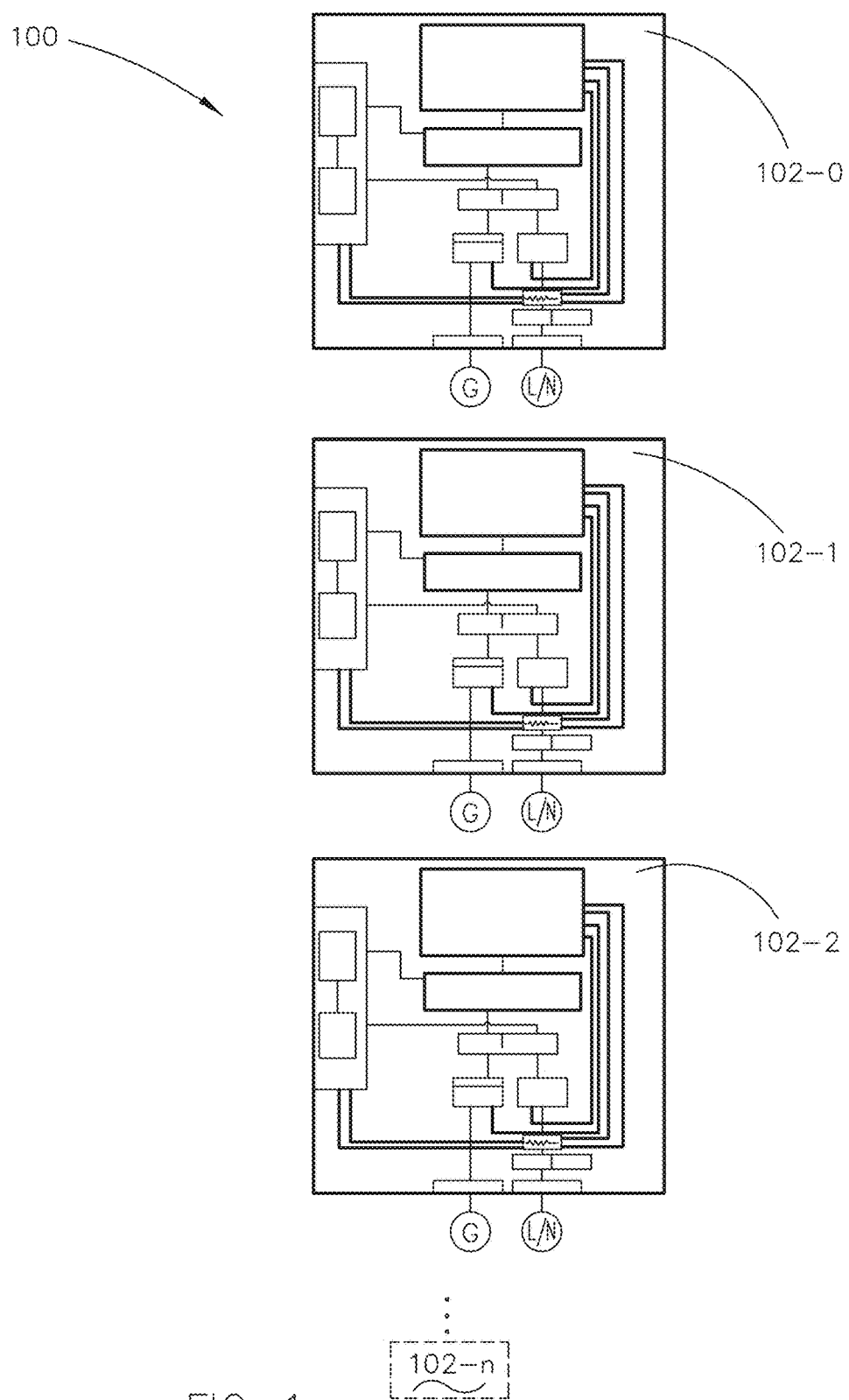
FIG. 1 is an embodiment of a block diagram representing a conductor and current monitoring system, according to the inventive concepts disclosed herein.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

"Autonomy" or "autonomous" as used herein shall mean an ability to perform a task at a degree or level of complexity akin to the complexity of human intuition. The higher the degree or level of complexity the system is able to perform, the more autonomy the system has, and the more value will be attached to that system.

"Automation" as used herein shall mean the use of circuits, monitors, interfaces, or combinations thereof to perform tasks normally performed by humans, with restraints or limitations with respect to the difficulty of tasks the machinery can perform. In other words, although automated systems may be increasingly optimized, even the most optimized automated system does not cross a gap that exists between optimized automated systems and autonomous systems.

"Memory" as used herein, and unless otherwise specified, means any storage medium known in the art suitable for storing program instructions executable by an associated one or more processors (e.g., computer executable program code). Memory may also be stored in an organized format, encompassing, for example, a database. Memory may include one or more storage mediums. For example, memory may include, but is not limited to, a read-only memory, a random access memory, a magnetic or optical memory device (e.g., disk), a magnetic tape, a solid state drive, or combinations thereof. In embodiments, memory includes a buffer (e.g., frame buffer, first-input-first-output (FIFO) buffer) and/or a cache. The memory includes non-transitory memory. In embodiments, the memory may be located externally with respect to the platform or a processor on the platform (e.g., as with a removable SD card).

"Processor" as used herein means any processing device, including but not limited to, a microprocessor, an application specific integrated circuit (ASIC), a field programmable gate array (FPGA), a central processing unit (CPU), an arithmetic logic unit (ALU), a digital signal processor (DSP), or combinations thereof.

"Module," "block" or "sub-block" as used herein means a combination of hardware and software configured to perform one or more steps, processes and/or algorithms of the inventive concepts disclosed herein.

Broadly, the inventive concepts disclosed herein are directed to systems, methods, and apparatuses with improved, precise, highly granular current monitoring as compared to conventional systems, methods, or apparatuses. The current monitoring includes group-wise and individualized monitoring of electrical current passing through switches, outlets, circuits, electrical conductors, or combinations thereof. User interfaces may provide tracking, warnings, set-points, predictive or preventative analysis, or other forms of output for data presentation. Reference frames for computing power usages, trends, or tuning parameters more precisely represent real-time scenarios by relying on modular reference points and individualized sensors, as opposed to generalized load analysis (e.g., monitoring solely at the electrical main). Further, hiccups, power bumps/surges, temperature variations, and other irregularities are smoothed by filtering, by continuity in monitoring, by referential monitoring, or by reducing deviations otherwise associated with power control and current monitoring.

The systems, methods, and apparatuses rely on efficient switching logic, where switching between channels of feed from sensors that are reading current flow associated with respective loads requires only a single input value. Because the switching logic incrementally switches based on the single input value (e.g., high input), the result of applying multiple single input values is a binary data set. Because a single high or low value iteratively applied to the binary data set results non-consecutive base-ten numbers, separate logic is used to map each resulting binary data set (i.e., resulting after iterative input values are applied) to a specific feed (e.g., reading) from a specific channel. In this regard, the specific feed is the result of monitoring a specific current load.

The monitoring apparatuses and systems enable monitoring of each individual circuit, creating a digital replacement or retrofitting means for current power distribution panels, monitoring apparatuses, and monitoring systems. Monitoring data is collected and transmitted to a data store where it may be formatted, analyzed, and displayed for an end user. Cost-effective individual sensors are used for the monitoring, enabling precision and monetary efficiency.

Referring now to FIG. 1, an embodiment of an electrical current monitor system 100 includes multiple (e.g., two or more) current monitor apparatuses 102-0, 102-1 . . . , 102-n communicatively coupled together (e.g., via WiFi, wired twisted pair, power-over-Ethernet (POE) coupling, power-line communication (PLC) coupling, or combinations thereof) in series. For example, a first monitoring apparatus 102-0 may be coupled to a live/neutral wire such as a residential electrical main to monitor the current flow through the live/neutral wire, a second monitoring apparatus 102-1 may be coupled to monitor one or more circuits within a circuit breaker box (e.g., connected on or within the circuit breaker and/or junction box), a third monitoring apparatus 102-2 may be coupled (e.g., WiFi, hard-wire, etc.) to monitor an individual endpoint, load, or appliance, and a fourth monitoring apparatus 102-3 may be coupled to monitor current flow to the ground. In this regard, a difference between the current flow measured at the main and the current flow measured at the ground may determine a total resistance or a total power usage. In some embodiments, the multiple apparatuses 102-0, 102-1 . . . , 102-n are daisy chained together.

Figure 2:
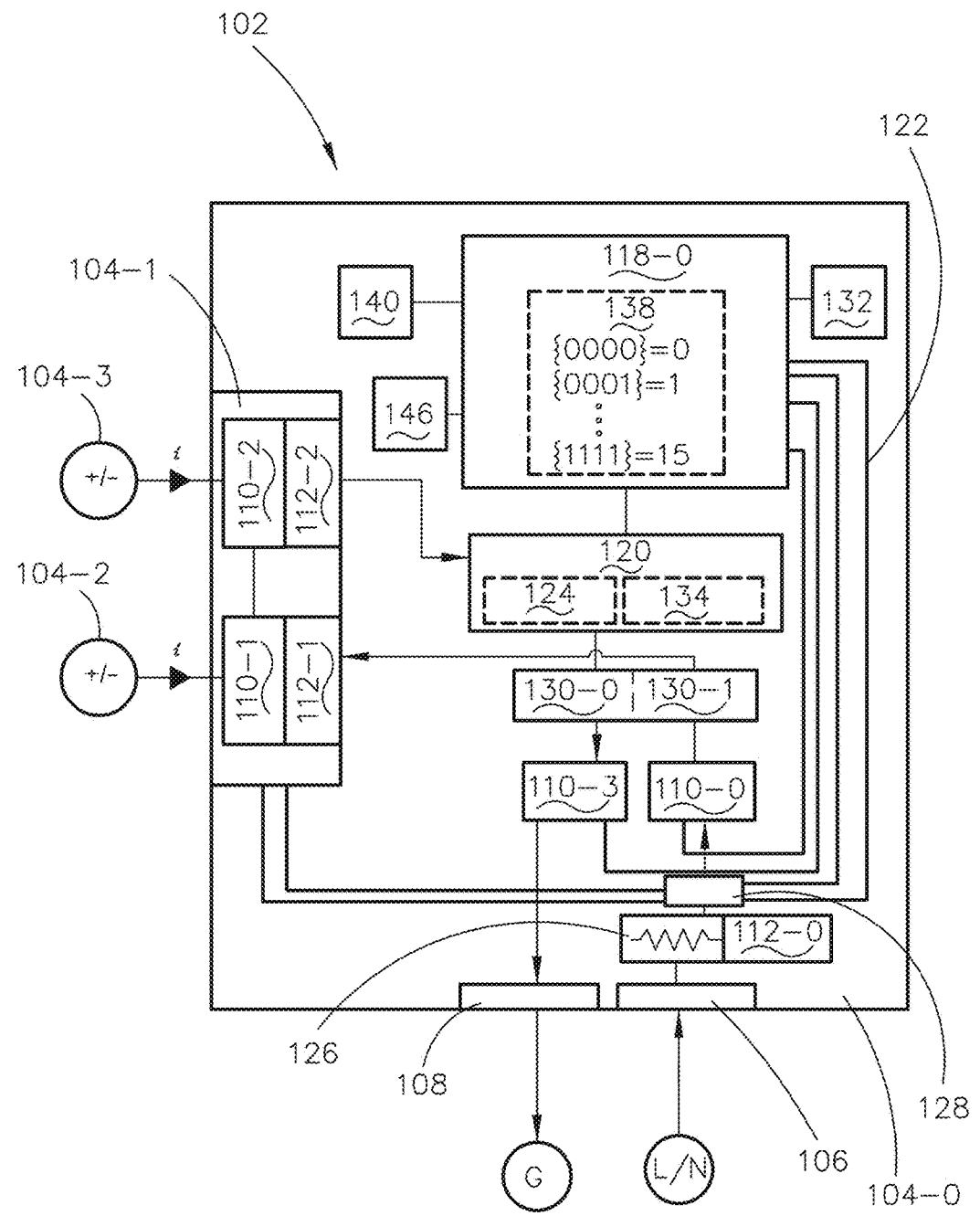
FIG. 2 is an embodiment of a conductor and current monitoring apparatus, according to the inventive concepts disclosed herein.

Referring now to FIG. 2, a current monitor apparatus 102 of the multiple current monitor apparatuses 102, 102a . . . , 102n includes an electrical current carrier 104 having an input 106 and an output 108, with multiple input sensing devices 110 (e.g., 110-0, 110-1, 110-2, and 110-3) attached in parallel to the input 106 (e.g., $V_{cc}$). The multiple input sensing devices 110 are configured to monitor current flow from the input 106 (e.g., $V_{cc}$) and in the current carrier(s) (e.g., 104-2, 104-3). For example, a first input sensing device 110-0 may be configured as a monitored first power supply and/or a back-up power supply such as a battery or a generator, where the monitoring enables a filtered power supply as well as the back-up power supply in the event the first power supply fails. A second and a third input sensing device 110-1 and 110-2 may be coupled to monitor a first and second live wire for respective, individual circuits. A fourth input sensing device 110-3 may be coupled to monitor current flow to the ground of the monitoring apparatus 102. It is noted that in some embodiments, the multiple input sensing devices 110 are daisy chained together. It is further noted that the input sensing devices 110 may be characterized in some embodiments as sensors for sensing a current flow, such as a Hall Effect sensor; however, in other embodiments, the input sensing devices 110 may be characterized as any device coupled to a processor to enable more accurate or more precise current monitoring, including but not limited to a temperature input device (e.g., thermometer, thermistor, heat sensor circuit, or combinations thereof), a variable resistor (e.g., metal oxide varistor (MOV), a rheostat, a potentiometer, a digital potentiometer, or combinations thereof), an interrupt module (e.g., a fuse), a power supply (e.g., battery and/or power converter), a memory (e.g., non-transitory solid state, etc.), a switching module (e.g., bus, SOC router, or combinations thereof), a system on chip (SOC), and combinations thereof.

In embodiments, the output 108 includes a terminal block and is configured as a common ground for the monitoring apparatus 102. In some embodiments, the output 108 is configured as a stable or constant source of current to be monitored by a reference or baseline sensor 110. In other embodiments, block/module 108 is configured as both the common ground and the stable or constant source of current monitored by the baseline or reference sensor 110.

It is noted that current flowing from the input 106 may follow the path to the ground after the output terminal block to create a closed circuit. In some embodiments, one or more interrupt modules 112 are included together with the monitoring apparatus 102 to physically and/or remotely interrupt the circuit, intentionally creating an open circuit. For example, the interrupt module 112 may be a digital relay switch communicatively coupled to a digital-to-analog converter (DAC). For instance, the digital relay switch may be configured to receive a digital input value and convey the digital value to the DAC to convert the value to an analog break in the circuit, creating the open circuit. By way of another example, the interrupt module 112 may include, but is not limited to, a fuse, a circuit breaker, an electromechanical switch, an oil/gas circuit breaker, and combinations thereof.

In embodiments, the current carrier 104 includes multiple current carriers. For example, a first current carrier may be a printed circuit board (PCB) motherboard unit 104-0, a second current carrier may be a daughterboard unit 104-1, and third and fourth current carriers 104-2 and 104-3 may be wires, feeds, or electrical branches associated with individual circuits.

In some embodiments the daughterboard unit 104-1 is fixed (e.g., with PCB conductive posts) to the motherboard unit 104-0. In other embodiments, the daughterboard unit 104-1 is remotely located with respect to the motherboard unit 104-0. For instance, the daughterboard unit 104-1 may be configured to monitor an individual endpoint and may be communicatively coupled to transmit (e.g., over wires, WiFi, Ethernet cables, etc.) the endpoint monitoring data to the motherboard unit 104-0.

In embodiments, a size (e.g., dimensions, amperage, resistance, Hall Effect voltage, etc.) of the mother board unit 104-0 and/or the daughterboard unit(s) 104-1 are tailored to the purpose for which it is used. For example, a motherboard unit 104-0 may be sized to replace an electrical panel of a common circuit breaker box, creating a digital circuit breaker box to replace an analog box. By way of another example, the motherboard unit 104-0 and the daughterboard unit(s) 104-1 may be sized to retrofit a common or existing circuit breaker junction box.

In embodiments, the input sensing devices 110 are analog-to-digital converters (ADCs). For example, the input sensing device 110 may include a sensor for converting an analog signal such as a voltage resulting from current flow to/from a current carrier 104 into a digital signal. For instance, the input sensing device may include a Hall Effect sensor, one or more induction coils, or similar ADCs.

In embodiments, the input sensing devices 110 are communicatively coupled to a central processing unit (CPU) 118 through a switching module 120. For example, a first input sensing device 110-1 may be coupled to the CPU 118 by a first trace/channel 122 etched or formed on or within the current carrier 104 such as the PCB material after receipt of a first single-bit input value 124. By way of another example, a second input sensing device 110-2 may be coupled to the CPU 118 by a second trace/channel 122 after receipt of a second single-bit input value 124. In other embodiments, one or more additional input sensing devices 110 may be coupled to the CPU 118 by way of a radio frequency (RF) channel 122-0. For instance, the CPU 118 may be located on or within a circuit breaker junction box, while a remote input sensing device 110 may be located at an electrical socket or an appliance, requiring either wired or wireless coupling (e.g., Ethernet twisted pair, WiFi, etc.) to the CPU 118.

It is noted that although not shown in FIG. 1 or FIG. 2, the current carriers 104$n$-$n$ of monitoring apparatus 102-$n$ are connected to the input sensing devices 110$n$-$n$, and the channels 122$n$-$n$ are operatively connected to 118$n$ (CPU) devices. In some embodiments, the input sensing devices 110$n$-$n$ are connected solely through the switching module 120, and they are permanently connected to power (e.g., Vcc) and ground.

In some embodiments, the input 106 and the output 108 include terminal blocks with a variable resistor 126 between the input terminal block (e.g., first terminal block) and the first input sensing device 110-0.

In some embodiments, the variable resistor 126 and a second interrupt module 128 are coupled with the input 106 of the monitoring apparatus 102 to scale or tailor the monitoring apparatus 102 to monitor a specific amount of current in current carrier 104. For example, parameters of an MOV and/or a fuse may be varied with respect to a type of input 106. For instance, the current carrier 104 may be the PCB motherboard unit 104-0 receiving power from an 80-264 VAC source or a 115-370 VDC source and the variable resistor 126 and interrupt module 128 ensure a proper output (e.g., 1-2 Watt power output). In some embodiments, the variable resistor 126 (e.g., MOV) and the interrupt module 128 (e.g., 1 Amp fuse) are used to ensure that the type of output to the PCB unit 104-0 from input 106 is approximately three to 24 VDC. In this regard, the variable resistor 126 may be used as surge protection for 230 VAC to a 5V power converter.

In embodiments, the variable resistor 126 may be varied according to a temperature at which the power converter or the PCB unit 104-0 are operating. For example, a power output of the power converter may be one Watt or two Watts depending on the temperature, thus, a resistance of the variable resistor 126 may be varied based on the temperature.

In some embodiments, the first interrupt modules 112 may also be variable. For example, an interrupt module such as module 112-1 or 112-2 may be with varied respect to a type of load, appliance, or circuit being monitored. For instance, the current carriers 104-2 and/or 104-3 may be a 10 Amp, a 30 Amp, or a 60 Amp circuit wire (e.g., copper, aluminum, silver, gold, etc.), supplying approximately 100 to 370 volts (100 to 300V+). In this regard, the first interrupt module 112 may include, but is not limited to, an actuator mechanism, contacts, terminals, bimetallic strips, arc divider/extinguishers, a reset button/switch, and combinations thereof. The components of the interrupt module 112 may be operatively coupled to allow for monitoring and/or receiving current from the respective current carrier 104-2 and/or 104-3 without overloading the circuit or the components of the monitoring apparatus 102. For instance, a first predetermined threshold amount, such as 30.3 Amps or 1% of a 30 Amp circuit, may result an overload condition, causing the interrupt module 112 to activate. It is noted that other predetermined threshold amounts are contemplated herein based on the current carrier 104, the circuit, the appliance, or the load being monitored.

In embodiments, the monitor apparatus 102 may further include a power supply 130-0, and/or a back-up power supply 130-1. For example, the input 106 may be coupled to an alternating current (AC) power source or a direct current (DC) power source. For instance, the motherboard unit 104-0 may include a 3-6V switched-mode power supply 130-0 to convert an 110V AC power input, to the 3-6V DC load voltage used by the motherboard unit 104-0. By way of another example, the back-up power supply 130-1 may include a 1.65 to 3.6V battery, to back up the external memory, or second memory (below) when the power supply 130-0 is not available.

In embodiments, components of the current monitor apparatus 102 are operatively coupled with each other. The operative coupling may include physical connections (e.g., printed circuit board (PCB) posts), logical connections (e.g., wireless or WiFi routing over one or more communication channels), digital connections (e.g., one or more digital signals from an analog to digital converter (ADC), a digital signal pattern generator (DSP), etc.), or combinations thereof. For example, the operative coupling may include a physical cobbling. For instance, one or more conductive PCB posts may be used for mounting a daughterboard unit 104-1 to the motherboard unit 104-0 according to a size and shape of a circuit breaker junction box. By way of another example, the operative coupling may include a contactless coupling, such as a sensed disruption in one or more magnetic fields, as with a Hall Effect sensor. By way of yet another example, the operative coupling of devices 110 and current source(s) 112 may include electronic conduction in a solid state such as with an integrated circuit (IC) where a semiconductor or other PCB material may be a current carrier 104 and one or more pins together with logical functions of the IC may be an input sensing device 110. By way of yet another example, the operative coupling may include repeating or non-repeating signals in the digital domain, producing logical values (e.g., logical 1's or 0's) as with a DSP.

In some embodiments, the current carriers 104 may include multiple current carriers 104-0 . . . 104n-n that are in use (e.g., drawing current), and multiple sources 112 that are configured for use but in real-time may not be in active use (e.g., are not drawing any current). In this regard, one or more extra daughterboard units 104-1 may be included with or without remote relays in a digital circuit board kit to allow for expansion, or to be used during peak or high usage times, such as with a seasonal residence where in some seasons all circuits may be used and in need of monitoring, while in other seasons, only a few circuits may be used.

In some embodiments, a sensor of an input sensing device 110 may be configured to receive inputs from at least two current carriers 104. For example, two circuit breaker wires, two branches from an electrical main, or two appliances may be monitored by a single input sensing device 110. The input 106 and output 108 of a motherboard unit 104-0 may also be monitored by an input sensing device 110, where the input 106 may be monitored in a positive direction and the output 108 in an opposite or negative direction. Therefore, in some embodiments, the total ratio, R, of a count, N, of input sensing devices 110 (e.g., sensors), to a count, M, of current carriers 104 (e.g., wires and monitored motherboard unit) is N=(M/2)+1, and R=N:M or, $$R = \frac{\left(\frac{M}{2} + 1\right)}{M}.$$

In other embodiments, one sensor of the input sensing device 110 of the multiple input sensing devices 110-0 . . . 110n-n is in communication with one current source 112 of the multiple current source 112-0 . . . 112-n. For example, a one-to-one ratio of input sensing devices 110 to current sources 112 may be used in a monitoring apparatus 102, and/or in a monitoring system 100. For instance, an input sensing device may be used for each circuit wire in a home or factory setting or for each power branch from an electrical main. In this regard, the motherboard unit 104-0 and the ground may be counted as separate current carriers 104, requiring separate input sensing devices 110.

In embodiments, the CPU 118 includes a microprocessor, an application specific integrated circuit (ASIC), a field programmable gate array (FPGA), a central processing unit (CPU), an arithmetic logic unit (ALU), a digital signal processor (DSP), or combinations thereof. For example, the CPU 118 may include an ARM processor. For instance, the ARM processor may include an STM32 ARM Cortex M3 microcontroller and a Cypress Wi-Fi chip, such as a particle photon processor. In some embodiments, the CPU 118 is tasked with reading monitoring data, buffering the monitoring data, formatting the data, and transmitting the data (e.g., to a server).

In embodiments, the electrical current monitor apparatus 102 includes memory. For example, the memory may be a first memory associated with or located within the CPU 118. By way of another example, the memory may be the first memory and a second memory 132 located external to the CPU 118, such as external solid state memory, flash memory, SD card, or combinations thereof. In some embodiments, the CPU 118 and the second memory 132 are coupled with the back-up power supply (e.g., battery) 130-1, and are configured to store one or more data transfers from the current monitoring apparatus 102, or each current monitoring apparatus 102-0, 102-1 . . . 102-n, in the event of communication failure (e.g., Internet goes down) or a power failure.

Figure 3:
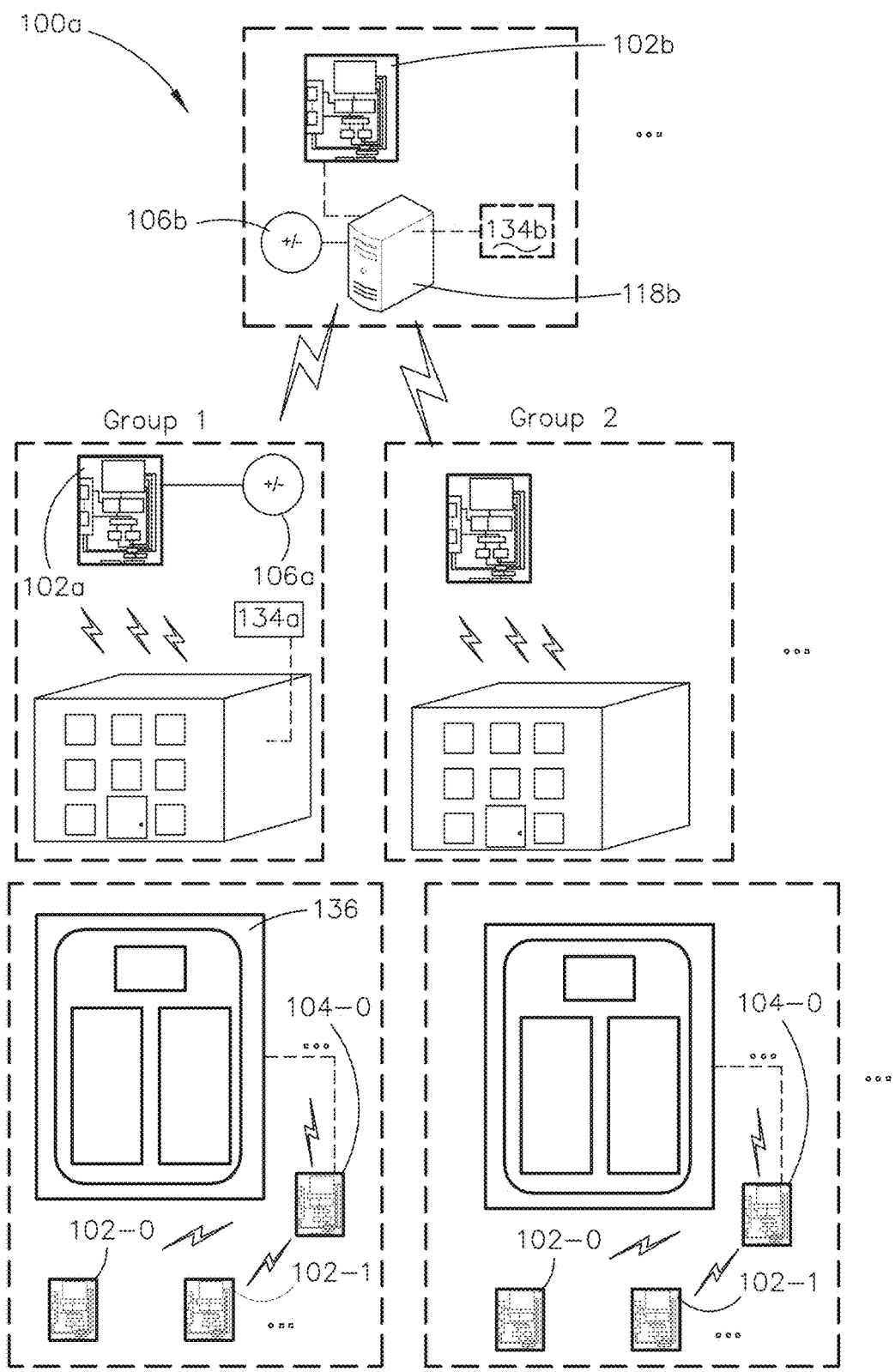
FIG. 3 is an embodiment of a multi-level diagram representing a conductor and current monitoring system, according to the inventive concepts disclosed herein.

Referring now to FIGS. 2 and 3, in embodiments, the current monitor apparatus 102 includes switching logic 134. In some embodiments, each current monitor apparatus (e.g., 102, 102a . . . 102n) in the system 100 includes a respective processor (e.g., 118, 118a . . . 118n) and respective switching logic 134, 134a . . . 134n. In some embodiments, at least one of the respective processors 118 is attached to a motherboard. In other embodiments, at least one of the respective processors 118 is attached to a daughterboard. In yet other embodiments, the CPU 118 is a first processor (e.g., 118-0) attached to a motherboard 104-0 that is in communication (e.g., via WiFi) with a second processor (e.g., 118-1) that is attached to a daughterboard 104-1. In this regard, the first processor 118-0 may be tasked with receiving sensor readings from the second processor (e.g., 118-1), or multiple second processors (e.g., 118-1, 118-2 . . . , etc.). The first processor 118-0 may be attached on or within a circuit box, while the second processor(s) 118-1 may be attached to individual loads (e.g., appliances, outlets, light switches, etc.), to provide more individualized, granular monitoring. In some embodiments, this individualized, granular monitoring includes balancing of individual or groups of loads. For example, an oven may use a capacity of a 30 Amp circuit, such that a user device may be configured to display a remaining capacity on that 30 Amp circuit, in the event a second oven or another appliance may be desired to be placed on that circuit.

In some embodiments, the motherboard unit 104-0 is a contactless unit such that a user installing the motherboard unit 104-0 need not connect, disconnect, or reconfigure electrical conduits into or out of an electrical circuit breaker junction box. In some embodiments, a daughterboard unit is a contactless unit. In some embodiments, the monitoring apparatus 102 includes an indicator (e.g., LED) to indicate when the apparatus 102 is in proper position with respect to one or more current carriers 104 being monitored. In some embodiments, the attachment to a circuit breaker junction box is a moveable or temporary attachment, such that an apartment owner may have multiple motherboard units 104-0, or may have a single motherboard unit 104-0 that is moved periodically between residential apartments to monitor usage on a broad scale (e.g., whether a circuit is in use or not, discover location of the usage, etc.). In other embodiments, the motherboard unit 104-0 is a more permanent attachment so that the monitoring in the residence is a continuous monitoring.

In some embodiments, the CPU 118, a bus, a router, and/or other network components are logically configured to receive data transfers (e.g., sensor reads) from the multiple processors (e.g., 118a . . . 118n) of multiple surrounding monitoring apparatuses 102 (e.g., as with a star topology). It is noted that the configuration of the CPU 118, network components, or multiple processors 118a . . . 118n is not limited to a single logical configuration, such as a star topology. For example, in some embodiments the logical topology may include a mobile ad hoc network (MANET).

In embodiments the system 100 may be implemented in a variety of different settings. For example, referring now to FIG. 3, system 100a may be implemented in a home or commercial residence energy monitoring setting. For instance, the electrical current monitor apparatus 102 may be attached (e.g., adjustable magnetic feet, screws, holes and receiving pins, or other attachment means) on or in a circuit breaker box 136 creating a replacement digital junction box or a retrofitted junction box. By way of another example, the apparatus 102a may be implemented within or in proximity to a network switch 134a having its own current source (e.g., input 106a), its own processor (not shown), its own switching logic (not shown), and its own input sensing devices (not shown).

In some embodiments, the network switch 134a may be communicatively coupled (e.g., WiFi, wired twisted pair, or other local area network (LAN) or wide area network (WAN) communication means) with multiple apparatuses 102 that may be networked together, each monitoring individual circuits or circuit breaker boxes, such as in an apartment complex. For example, the apparatus 102b may be implemented within, or in close proximity to, a server having its own current source (e.g., input 106b), processor 118b, switching logic 134b, and input sensing devices (not shown) for receiving monitoring compilations from different networks (e.g., as transmitted to the server via one or more network switches 134a) and/or for monitoring current loads in proximity to the server room.

It is noted that the inventive concepts disclosed herein are not limited to the home or commercial residence setting depicted in FIG. 3. For example, the apparatus 102c may be used in system 100b depicted in FIG. 4 in a manufacturing setting. It is noted that systems 100a and 100b may be similar to system 100 or to each other, except that they may differ with respect to the setting in which they are implemented, the different current carriers 104 being monitored, or the number of monitoring apparatuses 102, 102-0 . . . , 102-n used. For instance, a conveyor system may have multiple current carriers 104, such as live/hot wire 104c to a motor, a control arm (not shown), or combinations thereof, which may be communicatively coupled through a programmable logic circuit (PLC) and separately/individually monitored by apparatus 102c. Similar to system 100a, the apparatus 102c in system 100b, may be in communication with a network switch (e.g., 134d), networking the various monitoring apparatuses 102 of a factory. The network switch 134d, or multiple network switches 134d, may be in communication with a server 118e, which may be configured for receiving one or more monitoring compilations from different factory networks.

Figure 4:
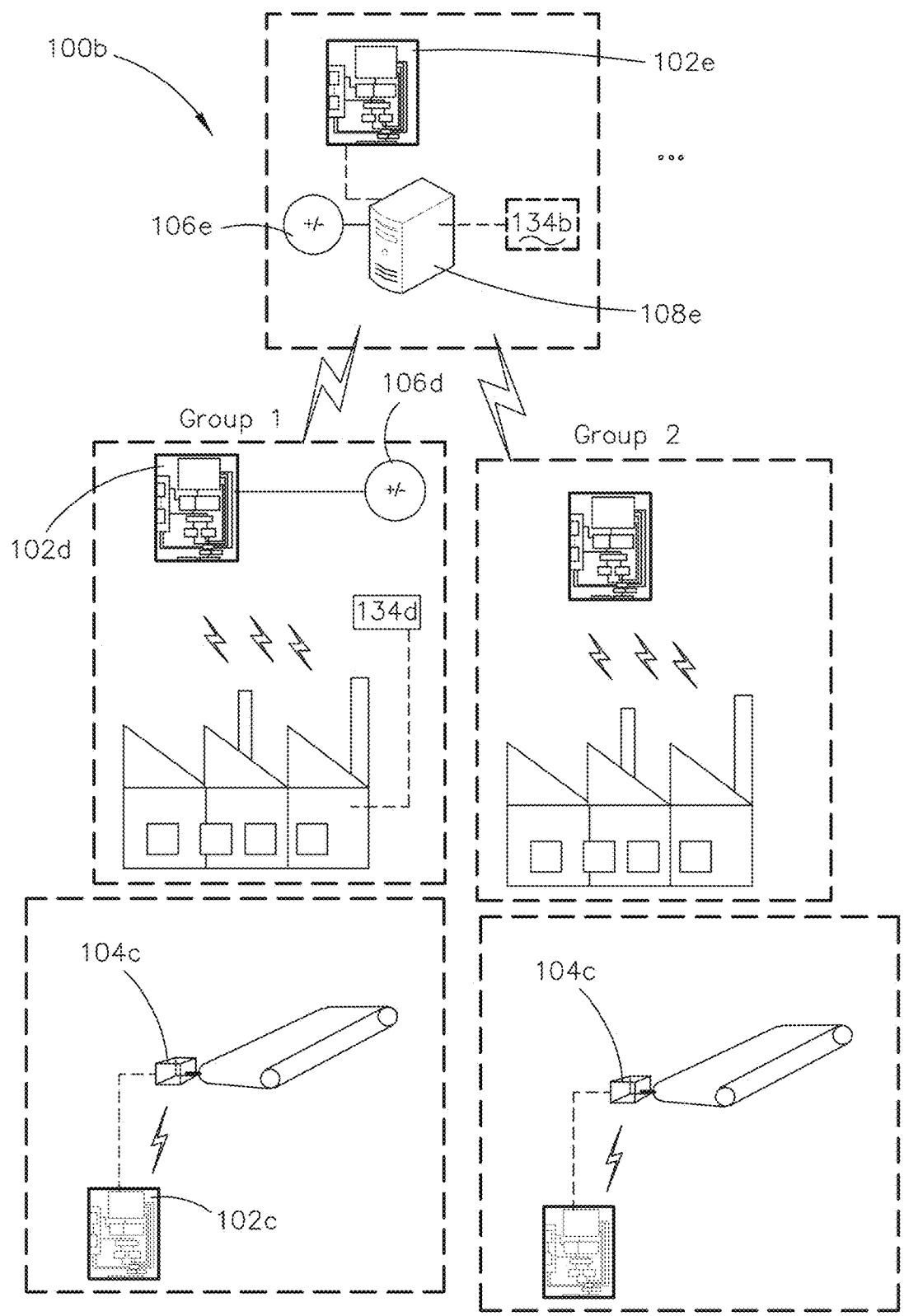
FIG. 4 is an embodiment of a multi-level diagram representing a conductor and current monitoring system, according to the inventive concepts disclosed herein.

In embodiments, as depicted in FIGS. 3 and 4, the configuration of the apparatus 102 may be applied within one or more tiers, layers, or levels of implementation. In this regard, a first current source 112 being monitored within a first tier may be different from a second current source 112 within a second tier by proximity and/or communicative coupling. For instance, multiple outlets, switches, and circuits within a home may be monitored within a first tier, and may use wired or wireless communications that have a range of approximately 30 to 100 meters (100 to 330 feet). Within a second tier, although similar current carriers 104 may be monitored, such as outlet wires, sockets, or circuit boxes associated with a server, a data presentation device (e.g., mobile device, tablet, laptop computer, etc.) may not always be in close proximity (e.g., 30 to 100 meters) in the server setting. Therefore, a second tier may have a different range of communicative coupling that may be increased by the use of another communicative protocol, such as TCP/IP, where the range is only limited by the range of an internet service provider (ISP). By way of another example, long range WiFi, or the use of a transmitter with increased transmission power and a directional type antenna (e.g., as opposed to omni-directional) may be used to increase a range associated with a monitoring apparatus 102 in the second tier. In some embodiments, a third tier may be separate and distinct from the first or the second tier by an amount of data that is transmitted and processed within the third tier. For example, in a first or second tier, a processor 118 may be tasked only with processing, analyzing, and presenting data from individual monitoring apparatuses 102 or from a group of monitoring apparatuses 102. In contrast, a processor 118 in the third tier may be tasked with processing, analyzing, and presenting data from multiple groups of monitoring apparatuses 102, where each group of the multiple groups may or may not be in the same geographical region.

Referring again to FIG. 2, in some embodiments, the electrical current monitor apparatus 102 includes multiple sets of logic (e.g., two or more logic circuits). For example, the switching logic 134 may be first logic circuitry and second logic circuitry 138 implemented by or within the CPU 118. The second logic circuitry 138 may be configured to correlate a set of one or more low values and one or more high values, such as a four-byte bit pattern, with a single channel 122 of multiple channels 122, 122-0 . . . , 122-n (e.g., correlate a set with an address) or to correlate the set with a single input device 110 of the multiple input devices 110-0 . . . 110n. For instance, the CPU 118 may be tasked with reading from each of the total number of devices 110-0 . . . 110-n at a specific time for each input sensing device 110, and it may do so in a continuous, non-sequential manner (i.e., non-sequential with respect to the devices) upon incremental and iterative receipt of the single-bit input value (e.g., digital signal and/or voltage application of 5V+) from CPU 118, where the inputs from CPU 118 are set sequentially. In this regard, the set of low or high values {1,1,1,1} may be correlated with a channel associated with the decimal-based number of 15 (e.g., channel #15).

In some embodiments, the CPU 118 or a second processor implementing the second logic 138 may operate at a faster speed/rate to receive the binary bit-patterns than when receiving the single-bit inputs from CPU 118 for the switching logic 134. For example, the binary-bit pattern may be a four-byte, bit-pattern and may take approximately four times longer to correlate with a device or channel than receiving the single-bit inputs from CPU 118 for data transfers from respective devices 110 or respective channels 122. Thus, in some embodiments, a clock rate associated with reading and/or correlating the binary-bit patterns may be increased as compared to the clock rate associated with receiving the single-bit inputs from CPU 118.

In some embodiments, a device discovery occurs upon initialization of the apparatus 102 (e.g., motherboard unit 104-0) to determine a size of the set or a number of the values that must be used in the set. In this regard, the apparatus 102 may receive a first, single initialization message. In other embodiments, the apparatus 102 may receive multiple initialization messages, where a single initialization message may be from one of the multiple devices (e.g., apparatus 102-0 . . . 102-n) in communication with the apparatus 102. The initialization message may include, but is not limited to, syncing pulses, node ID, message type, configuration indicators (e.g., indicating monitoring apparatus 102 is ready to monitor or is monitoring current source 112), or combinations thereof. For example, the device discovery may be an omni-directional listening that may occur to establish an ad-hoc network infrastructure of nodes and/or terminals. In some embodiments, a network bridge or switch (e.g., 134a) may act as a controller for the ad-hoc network. In this regard, the use of Ethernet (or similar protocol, such as one-wire or two-wire communication) may be used to address individual endpoints (e.g., outlet, light, socket, etc.).

It is noted that the inventive concepts disclosed herein are not limited to the use of only four input sensing devices 110 as discussed above. For example, apparatus 102 may be configured with eight or 16 devices 110. For instance, eight devices 110 may be operatively coupled with one or more current carriers 104 such that, using a binary input system, a total of 64 channels 122 could be read from by the processor 118. It is further noted that the switching logic 134 may not be limited to using a binary input system, but may utilize a tertiary or a quaternary input system (e.g., receiving three or four input states). In this regard, if a tertiary input system is used with the four devices 110, then 64 channels would be readable. In short, the switching logic 138 may be configured to read a number, H, of channels 122 based on the number, X, of devices 110 and the type of input system as $H=X^m$, where, m, is the number of states available according to the type of input system (e.g., binary=2 states, tertiary=3 states, etc.).

In some embodiments, the motherboard unit 104-0 includes an antenna and transceiver system 140 for receiving updates or for transmitting the monitoring data from the CPU 118 (e.g., to a server).

Data Acquisition

Figure 5:
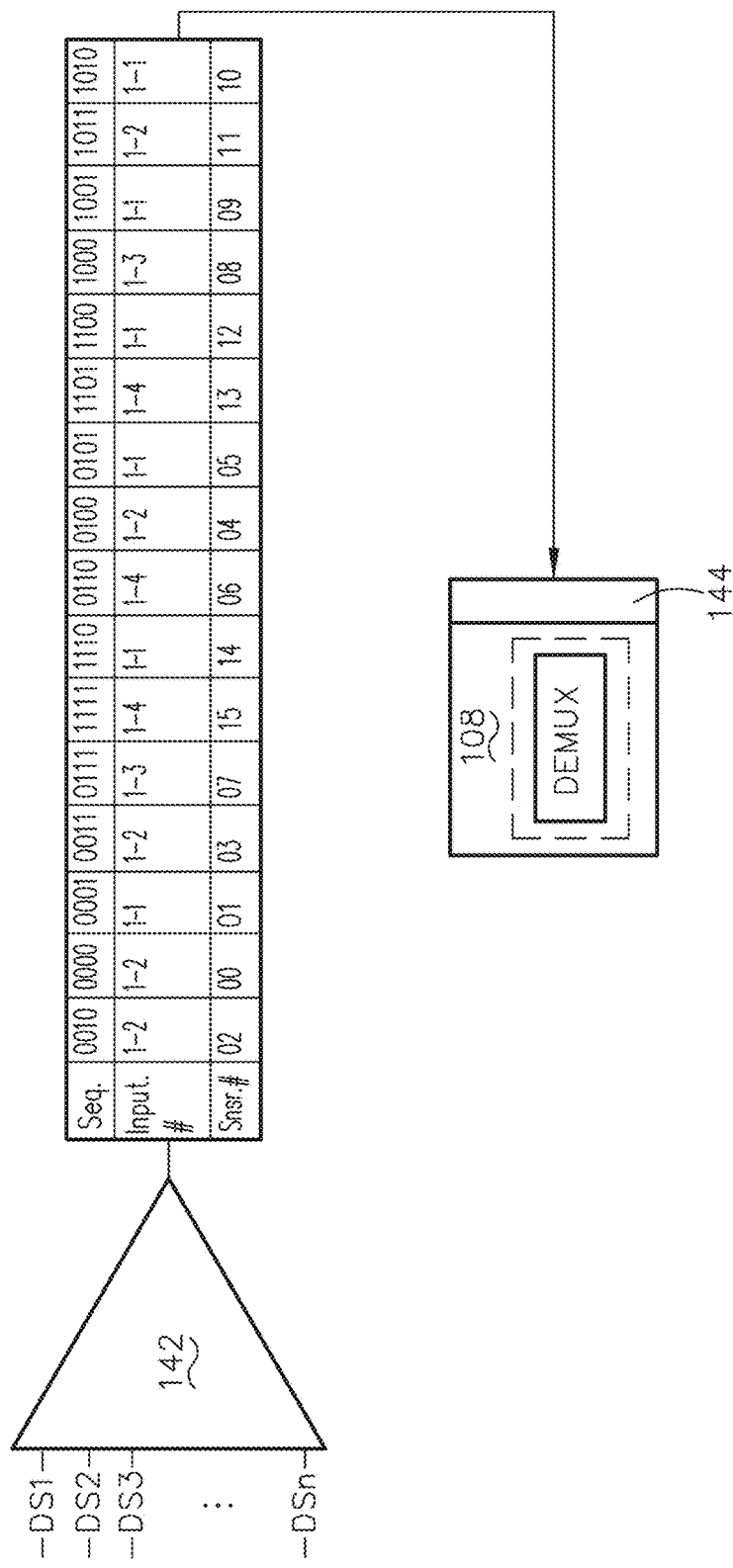
FIG. 5 is an embodiment of a bit-pattern sequence, according to the inventive concepts disclosed herein.

Referring now to FIG. 5, in embodiments, the apparatus 102 includes a multiplexer 142 module configured to receive data from each channel 122 in turn, as directed by the switching module 120 or a network controller (e.g., 134a). In this regard, a number of inputs into a network of monitoring apparatuses 102 (e.g., to gateway node) may determine how network channels (e.g., 122-0, 122-1, . . . 122-n) are communicated with. In other embodiments, a number of inputs into a monitoring apparatus 102 may determine how system and/or apparatus channels (e.g., 122a-0, 122a-1, . . . 122a-n) are communicated with.

In embodiments, the bandwidth allocation is optimized for efficiency, including energy efficiency. For example, a total number of bits used in a set may be equivalent to the number of input sensing devices available to the switch (e.g., module 120 or network switch 134a/134e) of the network, or to the monitoring apparatus 102. For example, if four devices 110 are available with a binary input system, then an eight byte, or a four-bit, set pattern is used to represent the digital input signals (e.g., DS1, DS2, . . . DSn) with either high or low values at each input sensing device 110. A digital input signal may include a single-bit value that is conveyed at a specific time to the one or more multiplexers 142 to trigger communication with a specific channel. In this regard, the sequence fed from the multiplexer 142 to the CPU 118 does not follow a binary sequential order (e.g., as switching between some sequential binary numbers requires more than a one-bit input value). Rather, the sequence is based on a single-bit input transitional feed (e.g., single-bit transitions between channel 122 feeds), relying on separate logic (e.g., logic 138) to map input device 110 IDs or addresses to a time and channel 122 over which monitoring data was received. In some embodiments, rather than mapping an input sensing device 110 ID to a channel, a channel 122 may have an ID or a number associated with it, such that when a device 110 is coupled to the CPU 118 by way of the channel 122, the CPU 118 may merely rely on the ID or the number of the channel 122 and the bit pattern to associate the feed with a specific input sensing device 110.

In embodiments, data from one of the one or more multiplexers 142 is read by the processor 118 through port 144. Prior to receipt at port 144, the data from the one or more multiplexers 142 may be received by a digital-to-analogue (DAC) converter. For example, port 144 may be an analogue port and the DAC may be positioned between the multiplexer 142 and the port 144. In some embodiments, a power supply may be received over the port 144. In other embodiments, port 144 may be used for programming a monitoring apparatus 102, as opposed to using firmware. In yet other embodiments, a monitoring apparatus may use both firmware and programming through port 144 (e.g., for updates, etc.).

In some embodiments, the port 144 may be implemented as a single, bi-directional port. For example, a USB coupler such as a USB A-type, USB B-type, and/or a USB C-type coupler may be used. In other embodiments, a fiber optic coupler such as a 3 dB, 50:50 (coupling ratio) bidirectional coupler may be used.

In some embodiments, the second logic 138 used by CPU 118 tracks which data reads (e.g., one or more packets) belong to which sensing devices 110. For example, the second logic 138 may include a demultiplexer (DEMUX) module for organizationally storing data from specific sensor readings. In some embodiments, the DEMUX may be used prior to sending packets to be stored in memory locations mapped to respective sensors 110. In some embodiments, the CPU 118 that uses the DEMUX module may be located in proximity to or within a server.

In some embodiments, time divisional multiple access (TDMA) is used by the network controller 134*a*/134*e* and/or switching module 120 to exchange data between network terminals. The CPU 118 may be configured to determine a respective channel 122 through the use of a time domain. In other embodiments, frequency division multiple access (FDMA) or code division multiple access (CDMA) may be used, such that the CPU 118 may be configured to determine a respective channel 122 through a frequency domain or a spreading code.

Data Analysis and Presentation

Figure 6:
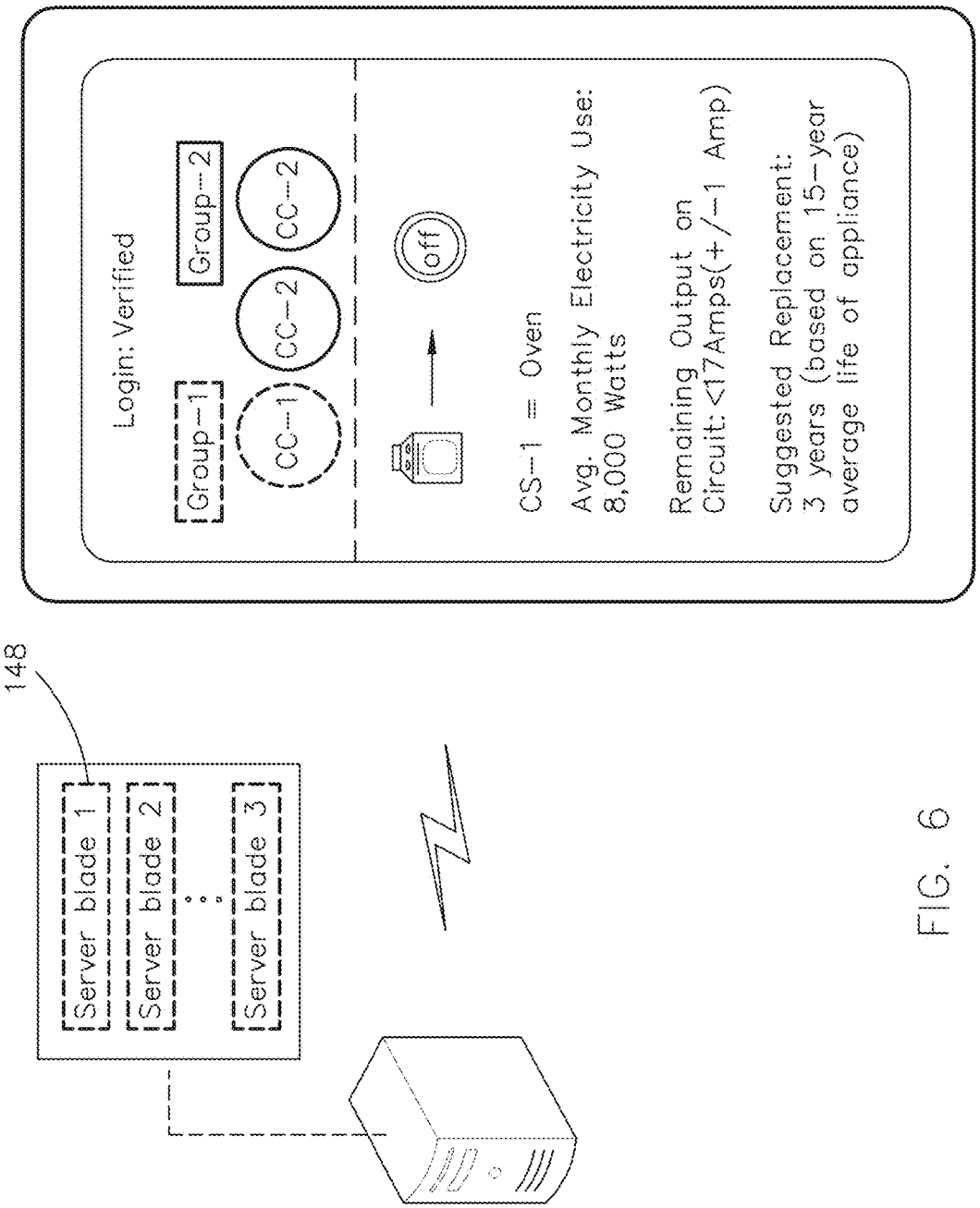
FIG. 6 is an embodiment of a user device and monitoring graphical user interface (GUI), according to the inventive concepts disclosed herein.
Figure 7:
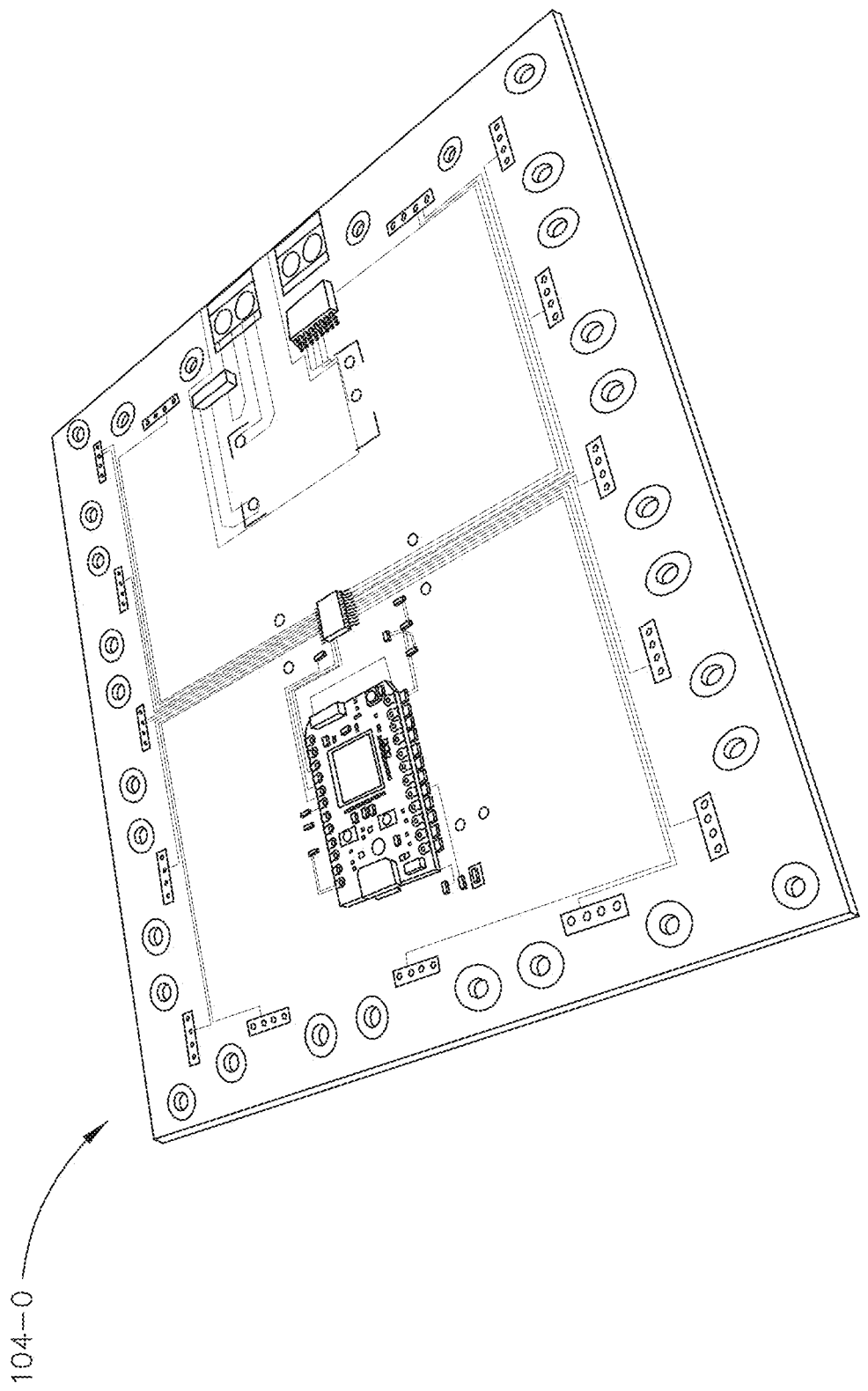
FIG. 7 is an embodiment of a monitoring apparatus and a motherboard unit, according to inventive concepts disclosed herein.

In embodiments, after the monitoring data is communicated (e.g., via WiFi, twisted pair, cross-over, etc.) to the CPU 118 or one of the multiple processors 118*a* . . . 108*n*, the data may be configured for analysis and/or presentation at the CPU 118 (e.g., FIG. 9), at the one of the multiple processors 118*a* . . . 118*n*, or it may be transmitted to a third processor (e.g., server 118*b* and/or 118*e*) for analysis and presentation on a user device (e.g., FIG. 6).

Referring now to FIG. 6, in some embodiments, a server may be configured to analyze, interpret, and present the data in one or more user-friendly formats. For example, the server may incorporate a neural network to analyze trends and patterns in electricity usage for a particular home, apartment building, or factory. The trends and patterns may be compared to determine interpretations of data compilations, pattern recognition, determination of electrical signatures for appliances, and combinations thereof. For example, current flow trends of a current carrier 104 associated with a new appliance may be compared with current flow trends associated with an old appliance (e.g., 5, 10, 15, or 20 years old, depending on the average life of the appliance). Based on differences between current flowing to a new appliance as compared to current flowing to an old appliance, a threshold and/or patterns of current flow could be set within a graphical user interface (GUI) to trigger and send a warning to a user that the appliance or a load for a current source associated with the monitored current carrier 104 is either in need of repair or replacement. For instance, a correlation of measured current flow to usage time (e.g., hours, minutes, seconds, etc.), normalized to a total life expectancy and end-of-life current flows for a given appliance may be used to determine a life-remaining or replacement indicator for the GUI.

In some embodiments, data may be stored in one or more physically separate server blades 148 based on an address associated with a sensor 110 or monitoring apparatus providing the monitoring data. For example, the server may be configured to store monitoring data from a first monitoring apparatus 102-0 in server blade 1, and monitoring data from a second monitoring apparatus 102-1 in server blade 2, and so on and so forth. It is noted that one or more backup or mirroring operations such as RAID (e.g., RAID 0, RAID 1, etc.) may be used.

In embodiments, linear regression models, polynomial fits, Monte Carlo data analysis, multi-dimensional scaling (MDS), canonical-correction analysis (CCA), or combinations thereof, may be used for analyzing the data to determine trends, usage patterns, electrical signatures, or other useful interpretations.

In some embodiments, the first processor 118 and/or the second processor (e.g., 118*a*) may include machine learning algorithms. For example, the first processor 118 or the second processor 118*a* may be a first controller that is configured for performing unsupervised learning aspects of machine learning, including but not limited to, data mining, prediction-making, or exploratory data analysis. In this regard, the second processor 118*a* or a third processor 118*b*/118*e* (e.g., server) may be a second controller, implementing supervised learning aspects. For example, the supervised learning aspects may include definitions and semantics defined and used by an operator that translate one or more current flows from one or more current carriers (e.g., 104-0) relative to at least a second current carrier (e.g., 104-1) into a meaningful representation used by users (e.g., 'Current carrier 104-0 using 2,000 Watts-circuit overload predicted with about 400 more/additional Watts'). The supervised learning aspects may also include output generated by the second controller (e.g., second processor 118*a* or a third processor 118*b*/118*e*) for actions that need to occur (e.g., 'Replace appliance', or 'Remove appliance from circuit'). In some embodiments, a processor 118 may use fuzzy logic, allowing one or more partial truth values to be output (e.g., from the neural network) instead of a complete false value or a complete truth (e.g., as in Boolean logic).

In an illustrative embodiment, a server with one or more monitoring data compilations stored thereon, may be communicatively coupled with an end user device (e.g., mobile phone, tablet, laptop computer, etc.). The end user device may be configured to receive and present an output generated by the server. For example, a first group of monitored current carriers 104 may include an oven cord with a maximum throughput of approximately 8,000 Watts (e.g., if each range were being used simultaneously). The server may be configured to provide data for presentation on the end user device that includes, but is not limited to, the type of current carrier 104 being monitored, an average monthly (e.g., daily, annual, etc.) electricity usage by the appliance, an electrical output available on the circuit to which the appliance is connected, a suggested replacement time, or combinations thereof. For instance, if the circuit is a 30 Amp circuit, and the oven may use a total of 4,000 Watts, and the voltage through the circuit is 240 Volts, then a simple calculation may be performed (e.g., either by the server, or the end user device based on the data provided by the server) to calculate a remaining capacity of the circuit (e.g., based on maximum throughput, and the relationship of a $P=\Delta V \times I$, the remaining capacity may be approximately 16 Amps). The result of the simple calculation may be displayed on the end user device. For instance, an estimated remaining capacity of less than 17 Amps may be presented with an adjustable degree of accuracy (e.g., +/−1 Amp), or a degree of error, associated with the estimate.

It is noted that the presentation may include a suggested replacement date of an appliance based on an amount of current used by the device (e.g., current carrier 104) and based on the monitoring of the current flow. For example, it may be known that an oven in use represents a resistor in the path of current flow, and so the relationship above may be represented as follows:

$$P = I^2 R = \frac{(\Delta V)^2}{R} \quad (1)$$

where using equation (1) the resistance of the oven may be approximately four ohms. In some embodiments, if the initial amount of resistance calculated from Equation (1) differs from a real-time amount of resistance calculated using Equation (1), according to a predetermined threshold (e.g., 5-60% of initial value), then the end user device may display a calculated/estimated replacement time based on trend data for new and old appliances of this type.

In some embodiments, the Hall voltage, $\Delta V_H$, may be used to determine the calculated/estimated replacement time. For example, the conductor of the current carrier 104 may include copper wire. A number of electrons in a conductor may be found using one mol of copper, Avogadro's number, the density of copper (about 8.95 g/cm3), a typical cross-sectional area of 12-guage wire, which is used in many residential buildings (e.g., $3.31 \times 10^{-6}$ m$^2$), according to the following:

$$n = \frac{6.02 \times 10^{23} \text{electrons}}{7.09 \text{ cm}^3} \left( \frac{1 \times 10^6 \text{ cm}^3}{1 \text{ m}^3} \right) = 8.49 \times 10^{28} \text{ electrons}/m^3 \quad (2)$$

It is noted that the charge of an electron is approximately $1.6 \times 10^{-19}$ Coulombs. It is further noted that a typical magnetic force in the sensors 118 of some embodiments (e.g., Hall Effect sensor) may be approximately 0.45 mT/A. Because the sensors 118 may be tailored for amperages of from 5 Amps to 65 Amps (e.g., 5+/−, 10, 10+/−, 12+/−, 20, 20+/−, 30+/−, 30, 50+/−, and 65+/−), the magnetic force of the Hall Effect sensor will vary depending on the amperage of the current carrier 104 being monitored. Because the density of copper, or any conductive or semi-conductive material may vary with temperature, a thermistor may be used to compensate for temperature effects.

In embodiments, the following relationship may be used to determine an expected Hall voltage, $V_H$, for the sensor (e.g., Hall Effect sensor) of the input sensing device 110:

$$\Delta V_H = \frac{IB}{nqt} \quad (3)$$

where, I, is the current in Amps, B, is the magnetic force in Tesla (T) units, n, is the number of electrons flowing in the conductor per volumetric unit (e.g., m3), and, t, is the thickness of the conductor in meters.

In an illustrative embodiment, the Hall Effect voltage for a sensor 110 monitoring a 30 Amp circuit using a 12-guage wire having a thickness of approximately 0.00205 meters (0.081 inches), the Hall Effect voltage may be determined as follows:

$$\Delta V_H = \frac{IB}{nqt} = \left( \frac{\frac{0.45 \text{ mT}}{A} \times (30 \text{ A}) \times \frac{T}{0.001 \text{ mT}}}{\left(8.49 \times \frac{10^{28} \text{ electrons}}{m^3}\right) \times (1.6 \times 10^{-19} \text{ C}) \times (0.00205 \text{ m})} \right)$$

16.2 μV

It is noted that the size of the wire may vary, the specific amperage of the circuit being monitored may vary, the thickness of the conductor may vary, the Hall coupling factor may vary (e.g., based on the sensor, for instance a coupling factor of 1.1 mT/A may be used), and the type of the conductor (e.g., aluminum, silver, gold, etc.) may vary and still fall within the inventive concepts disclosed herein. It is further noted that because the Hall voltage is proportional to the amperage of the current carrier 106 and the electron flow through the conductor, it is a useful indicator to determine when an appliance, or other circuit load, is deteriorating or no longer functioning properly. For instance, the predetermined threshold may be set relative to the initial Hall voltage, and if the real-time Hall voltage differs from the initial value by the threshold amount (e.g., 5-60%), then a warning may be presented and the calculated/estimated replacement time displayed. In this regard, the calculated/estimated replacement time may be based on the average life span of the appliance (e.g., 15 years for an oven) and the amount the real-time Hall voltage or resistance of the appliance differs from the initial measured value(s).

In some embodiments, a power output measured by a monitoring apparatus 102 may be integrated over a time interval to determine a total energy consumption of a device, circuit, residence, or factory-depending on the setting and configuration for which the monitoring apparatus 102 or a group of monitoring apparatuses are used. In some embodiments, a measured resistance is integrated over a time interval to determine a total resistance over the time interval. The total resistance may be correlated with a life span of the appliance. In some embodiments, a Hall Effect voltage output may be integrated over a time interval and correlated with the life span of an appliance to determine a remaining life expectancy of the appliance. In some embodiments, a magnitude of a Hall Effect voltage output may be correlated with an amount of current flow from a current carrier 104 to determine a user interpretation, such as a power consumption of the appliance.

In embodiments, linear regression models, polynomial fits, changes in real power versus changes in reactive power, Non-Intrusive Load Monitoring (NILM) techniques, current waveforms, delta waveforms, frequency, time-based resistance analysis, and other data analysis functions and/or means may be used to generate an electrical signature for an appliance, a circuit, a residence, a factory, a load, or for whatever a monitoring apparatus 102 (or group of apparatuses 102) may be monitoring. The electrical signature of the appliance, circuit, load, etc., may be used by a machine learning module to make a determination or identification, including but not limited to, identify a type of the load, determine an ID associated with the load, determine a verified status of the load, determine a life expectancy of an appliance, and other user interpretations. For example, if the signature is determined at a first point in time according to phase, geographic location, Hall Effect voltage output, circuit type, or any of a number of factors that will be recognized by those skilled in the art, then when the load is used again at a second point in time, the monitoring apparatus 102 or the CPU 118 may be able to correlate the current flow at the second point in time with the signature determined at the first point in time, further enabling a user interpretation (e.g., ID of the appliance, status of the appliance such as on/off, life remaining of the appliance, etc.). For instance, if a first portion of the signature is determined to have changed, while the remaining or second portion of the signature remains the same, then a life expectancy may be determined. In this regard, the first portion may be a resistance or a measured Hall Effect voltage output that has changed sufficiently over time to indicate that the appliance is no longer functioning at maximum capacity, thereby resulting in a determination of a replacement date or a life expectancy remaining. This determination may occur based on a comparison with other similar appliances, or based on a rate-limiting or key component of the appliance—e.g., the heating element in an oven, where only the key component might be replaced instead of the entire appliance.

In some embodiments, the current carrier 104 monitored may include a device that intentionally varies a voltage supply (e.g., dimmer switch), and thus at least two parameters may be calculated, derived, and/or monitored to provide a useful interpretation from monitoring data generated. For example, if a triad/triac dimmer switch is being monitored by monitoring apparatus 102, a single parameter may not be sufficient to determine a remaining life span of the dimmer switch. Therefore, in some embodiments, two or more parameters including a delta parameter, such as $\Delta V_H$, and a time over which the change in the delta parameter occurred. For instance, a change in the delta parameter that occurs within a relatively short period of time after current flow through the device is detected may indicate that the device uses an intentional variable voltage supply (e.g., the device is a dimmer switch). Because the device is determined to use a variable voltage supply, the monitoring apparatus 102 may be configured to monitor the device differently, such as long-term monitoring of only the initial Hall voltage to determine the life remaining in the device, where the initial Hall voltage may be received when the device initially turns on (e.g., time T0 to T1, where T0 is when the device is turned on and T1 is the time at which a first voltage transition, or dimming, occurs).

Switching Modules

In embodiments, the switching logic 134 of switching module 120 may be configured for communicatively coupling a single channel 122-0 of multiple channels 122-0 . . . 122-$n$ with the CPU 118 upon receipt of a value from a single input sensing device 110-0 of the multiple input sensing devices 110-0 . . . 110-$n$. Because in some embodiments the CPU 118 is tasked with providing a continuous transfer of data (e.g., sensor readings), the switching logic 134 must be configured to function relatively quickly. Thus, in some embodiments, the switching logic 134 receives only a single-bit value to switch between data transfers. By receiving the value of the single-bit input, the CPU 118 may be able to process the value and interpret the value as a trigger to separately and individually communicate with the respective single channel 122-0 of the multiple channels 122-0 . . . 122-$n$. For example, a first single-bit input may cause the CPU 118 to read from the first single channel 122-0, while a second single-bit input may cause the processor 118 to read from a second single channel 122-1, and so on. Upon reading from a last channel 122-$n$, the processor may cycle back through to the first single channel 122-0, providing a continuous stream of monitoring data at a highly granular level. In some embodiments, a channel 122 may be a physical channel, such as a conductive line or a PCB via etched or formed on/in the circuit board. In other embodiments, the channel 122 may include a radio frequency (RF) channel configured for communication according to a wireless (e.g., Ethernet, WiFi, etc.) protocol.

In some embodiments, by receiving a value from each input sensing device 110-0 . . . 110$n$-$n$, a respective processor 118 of the multiple processors 118$a$ . . . 118$n$ may be configured to communicate, separately and individually with each channel 122 (e.g., at different time for each channel) of the multiple channels 122-0 . . . 122$n$-$n$. The receiving of each value (e.g., high input, such as 2.5V+ or 5V+) may be an iterative receipt of values from the input 106. It is noted that the switching logic 134, the processor 118, and the multiple input sensing devices 110-0 . . . 110-$n$ are operatively coupled to enable precise power conductor and current monitoring. It is further noted that each switching logic 134, 134$a$ . . . 134$n$, each processor 118, 118$a$ . . . 118$n$, and all of the multiple input sensing devices 110-0, 110$a$-0 . . . 110$n$-$n$ are operatively coupled to enable granular, scaled, and precise power conductor and current monitoring.

In an illustrative embodiment, the switching module 120 that implements the switching logic 134 for the apparatus 102 uses four devices 110-0, 110-1, 110-2, and 110-3. Because there are four devices 110 available to receive voltages from a respective current carrier 104, the number of channels 122 the switching logic 134 may be configured to switch between in this illustrative embodiment is 16, or channels 122-0, 122-1, . . . 122-15. With the switching module 120 reacting to low and high input voltages on the control inputs, its behavior can be described as a 4-byte, bit pattern (e.g., {0000} through {1111}; or 0 through 15) switching. The CPU 118 reads these voltage inputs from a current source (e.g., input 106) and respectively reads from devices 110-0 through 110-3 sequentially (e.g., not in parallel). This means that there is a finite time required for the switching module 120 to react to the input and change the control channel 122.

In some embodiments, the switching logic 134 may incorporate differential Manchester encoding. For example, a transition between input values may indicate a logical value.

It is noted that the switching module 120 differs from conventional switches. For example, if a conventional sequential bit sequence (e.g., 0000, 0001, 0010, 0011, 0100, etc.) were used in the switching logic 134, then a result of switching between some binary numbers (e.g., 0011 to 0100 or from decimal 3 to decimal 4), would require the use of two or more voltage inputs or digital inputs when switching between the binary numbers. However, the switching logic 134 functions differently than conventional switches. For example, only a single bit change is required to switch between each of the channel channels 122, resulting a specific binary sequence that caters to efficient use of devices 110. For instance, the sequence may be 0000, 0001, 0011, 0111, 1111, 1110, etc. In this regard, the second logic 138 tracks which channel 122 corresponds with a set of the binary values, for instance the set {1111} may correspond to channel 15. In some embodiments, the switching module 120 further differs from conventional switches as it may be implemented as a system-on-chip (SOC) switch/router.

In some embodiments, switching module 120 is a multi-layer switch. For example, the module 120 may be implemented within multiple layers of the system 100. In other embodiments, the multi-layer switch 120 is capable of routing in addition to being capable of bridging. For example, the multi-layer switch 120 may have layer-2 functionalities and layer-3 functionalities, where layer-2 and layer-3 refer to abstraction layers such as the data link layer and physical layer in the Open Systems Interconnection (OSI) model. By way of another example, the multi-layer switch 120 may be a layer 4-7 switch, having capabilities for content switching, web switching, an/or application switching using packet information and load balancing. For instance, a group of servers may share some of the supervisor learning aspects, or may share some of the data compilation aspects, such that a client or end user device of the network may not know which server of the group of servers is handling requests.

Current Carriers and Current Sources

In embodiments, there may be more than one type (e.g., two or more) of current carrier 104 that is being monitored by a monitoring apparatus 102. For example, a first type of current carrier 104 that may be monitored by an apparatus 102 may proportionally provide a voltage of approximately four to six volts (4-6V). A second type of current carrier 104 that may be monitored may proportionally provide a voltage of approximately 100 to 250 volts throughout the circuit or group of appliances/devices that are being monitored. A third type of current carrier 104 that is monitored may be configured to use or facilitate usage of approximately 110-220 volts. In some embodiments, the voltage from a current carrier 104 may be represented by a digital signal. By way of another example, a fourth type of current carrier 104 that is monitored may be based on the type of current supplied. For instance, the fourth type of current carrier 104 may be differentiated from other types based on a use of alternating current (AC) as opposed to direct current (DC), or visa-versa. In this regard, if a current carrier 104 uses AC, a sub-category of the current carrier 104 may include categorizations based on how the AC flow is used. For instance, if a current carrier 104 being monitored is connected to a variable resistance dimmer switch, or a triode/triac device or dimmer switch, the monitoring may be treated differently than the monitoring of a current carrier 104 that does not intentionally vary the amount of voltage across the device (outlet/socket). In this regard, the different treatment may include, but is not limited to, one or more different signatures, patterns, and/or thresholds for determining a user interpretation, such as a life remaining in the appliance.

In some embodiments, the types of current carriers 104 monitored vary based on amperage. For example, a current carrier 104 may include, but is not limited to, a 10 Amp, a 30 Amp, or a 60 Amp current carrier.

In some embodiments, the different types of current carriers 104 may be monitored for different reasons. For example, the first type of current carrier 104 may be monitored to determine when a channel 122 should be communicatively coupled with the CPU 118 to receive a sensor reading over that channel 122. The second type of current carrier 104 may be monitored to determine trends, patterns, and amounts of the flow of current (e.g., or electricity usage) associated with the respective current carrier 104. A third type of current carrier 104 may be monitored to determine when an intentional interrupt in current flow should occur. A fourth type of current carrier 104 may be monitored to determine an amount, type, signature, pattern, or combinations thereof, associated with ancillary power being supplied (e.g., amount of power supplied by DC generator).

In some embodiments, the current carrier 104 includes a printed circuit board (PCB) material such as a semiconductor for use in enabling digital monitoring. For example, the PCB material may include silicon or other semiconductor material of a motherboard unit 104-0.

In some embodiments, the current carrier 104 includes a circuit breaker live/hot wire or a branch from an electrical main. For example, a copper circuit wire outlet may be monitored by an input sensing device 110 to determine when an intentional interrupt should occur, such as in the event of a circuit overload. It is noted that the conductive material of copper is not limiting, as the current carrier 104 may include, but is not limited to, silicon, gallium, copper, aluminum, silver, gold, other conductive and/or semi-conductive materials, and combinations thereof.

In some embodiments, the current carrier 104 includes an outlet plug wire of an appliance. For example, an input sensing device 110 may include a Hall Effect sensor creating two separated magnetic fields, and the outlet plug wire or the blades of the plug may be electrically connected between the magnetic fields to disrupt the magnetic fields. The CPU 118 may correlate or determine the amount or measured disruption to be proportional to a digital output from the input sensing device 110.

Sensors

In embodiments, the input sensing devices 110 include sensors communicatively coupled to monitor current flow from or through a respective current carrier 104. For example, the sensors may include cost-effective, contactless Hall Effect sensors. For instance, the Hall Effect sensors may be a component of a small outline integrated circuit (SOIC), such as an 8- or 16-pin SOIC. In other embodiments, the Hall Effect sensors are not contactless, in that they require a hard-wire input and output.

In embodiments, the sensors are configured to receive power from a power supply and return a sensor reading that is proportional to the amount of power received from the power supply. For example, a sensor that receives a $V_{cc}$ of 4-6V+ from a power supply may be configured to return a sensor reading ($VI_{out}$) of one-half the power supplied plus an additional amount that is proportional to the current flowing through a current carrier 104. For instance, a sensor reading, $VI_{out}$, may be provided as $VI_{out}=0.5(V_{cc})+V_{OE}$, where, $V_{cc}$, is the power supplied and, $V_{OE}$, is the offset voltage, the deviation from the ideal quiescent value of the sensor, or the additional voltage due to the current flow sensed/monitored by sensor. It is noted that in some embodiments, the ideal quiescent value of the sensor of sensing device 110 is $0.5 \times V_{cc}$ for bidirectional devices or $0.1 \times V_{cc}$ for unidirectional devices.

In embodiments, a current flowing to the output terminal block and to the ground of the monitoring apparatus 102 is measured by an input sensing device 110 (e.g., 110-3) to provide a baseline reading for at least one additional input sensing device 110 (e.g., 110-1 and/or 110-2). For example, current flowing to the ground is usually negligent, but at times it may be significant enough to be a measurable current source. In this regard, the measured current flow to the ground provides the baseline reading (e.g., one-half of input provided when there is a sensed current of approximately zero Amps) to the at least one additional input sensing device (e.g., 110-1 and/or 110-2). For instance, a second input sensing device 110-1 and a third input sensing device 110-2 may be monitoring current flowing respectively from second and third current carriers 104-1 and 104-2 such as one or more live wires or electrical circuit feeds, and may be configured to produce an accurate output while simultaneously reducing fluctuations using the baseline reading from the input sensing device 110-3 that is measuring the current flow to the ground.

In some embodiments, the reference or baseline input sensing device 110 may return a value of less than one-half the input (e.g., $V_{cc}$). For example, a value of less than 2.5V may represent a negative current flow through a respective current carrier 104 being monitored.

In embodiments, one of the sensors may be implemented on a motherboard apparatus 104-0 as the reference or baseline sensor. The reference or baseline sensor may be read by the CPU 118 through the switching module 120 in order to account for the voltage drop through the module 120. For example, a precise reading from a specific sensor of the devices 110-0, 110-1 . . . 110-*n* may be calculated as a difference between the reading from the specific sensor, e.g., 110-1, and the reading from the reference sensor 110-3. Because the reference sensor is connected to the ground, which should have zero current flow, the sensor reading, or quiescent value, should always be one-half of the $V_{cc}$ value (e.g., $0.5 \times V_{cc}$). For instance, for a monitored current carrier 104 that is in communication with a bidirectional output device, where $V_{cc}$=5.0 V, then $VI_{out(Q)}$=2.5 V.

In some embodiments, a reading that is not one-half of the $V_{cc}$ represents a fluctuation that may exist on the other sensors of devices 110-0, 110-1 . . . , 110*n*-*n*. Thus, by taking the difference between the reference reading and the reading of the other sensors of devices 110-0, 110-1 . . . , 110*n*-*n*, the fluctuations are removed from the reading, $VI_{out}$, of the specific sensing device, e.g., 110-1. It is noted that the fluctuations may be due to resolution of the quiescent voltage trim and/or thermal drift. Therefore, in some embodiments, the CPU 118 may be in communication with a thermistor 146 in order to correlate a specific sensor reading with a specific temperature and compensate for any error that may exist due to generating output at that specific temperature.

In some embodiments, a reading that is not one-half of the $V_{cc}$ represents a potential short circuit condition in the circuit, appliance, or load (e.g., current carrier 106) being monitored. In this regard, it is noted that circuit breakers, switches, outlets, and sockets are configured to switch off, or result an intentional interrupt, when flow to the ground increases above a threshold amount. This interrupt is usually the result of a mechanical interrupt (e.g., fuse breaks the circuit, circuit breaker trips, etc.). These mechanical interrupts may be prone to error (e.g., wear and tear) or may be slow. Therefore, in some embodiments, a monitoring apparatus 102 may include an input sensing device 110 (e.g., 110-1) configured to receive a hot/live wire as an electrical input and convey an electrical output to the ground, creating a closed circuit. In this regard, the apparatus 102 may include a relay switch configured to cause an intentional interrupt when the current sensed through the ground rises above a threshold amount, creating an open circuit as a result of one or more received digital signals. For example, it may be determined that the current of a current carrier 104, such as the ground, monitored by the reference sensor 110-3, as determined based on the Hall voltage is greater than a threshold amount, and an intentional interrupt occurs. In some embodiments, this intentional interrupt may occur remotely based on an authorized user input. In other embodiments, the intentional interrupt is automatic. The intentional interrupt may occur for one or more reasons, including but not limited to, preventing damage throughout the circuit due to an overloading current flow, energy efficiency, scheduled repair, or combinations thereof.

In some embodiments, only a portion of the input sensing devices 110, such as the Hall Effect sensors, are connected to the CPU 118 through the switching module 120. In other embodiments, each of the input sensing devices 110 are connected to the CPU 118 through the switching module 120.

Referring now to FIGS. 7-11, in embodiments, the input sensing devices 110 are tailored to the current carrier 104 that will be monitored. For example, a sensitivity of the sensor 110 may be proportionally defined as a change in output in response to a 0.5-2.0 Amp change through the primary conductor of the current carrier 104. The sensitivity may be proportional to a magnetic coupling factor and a linear amplifier gain, where the linear amplifier gain may be adjustable to optimize the sensitivity of the sensor 110 to the current flow through the conductor of the current carrier 104 being monitored.

Figure 10:
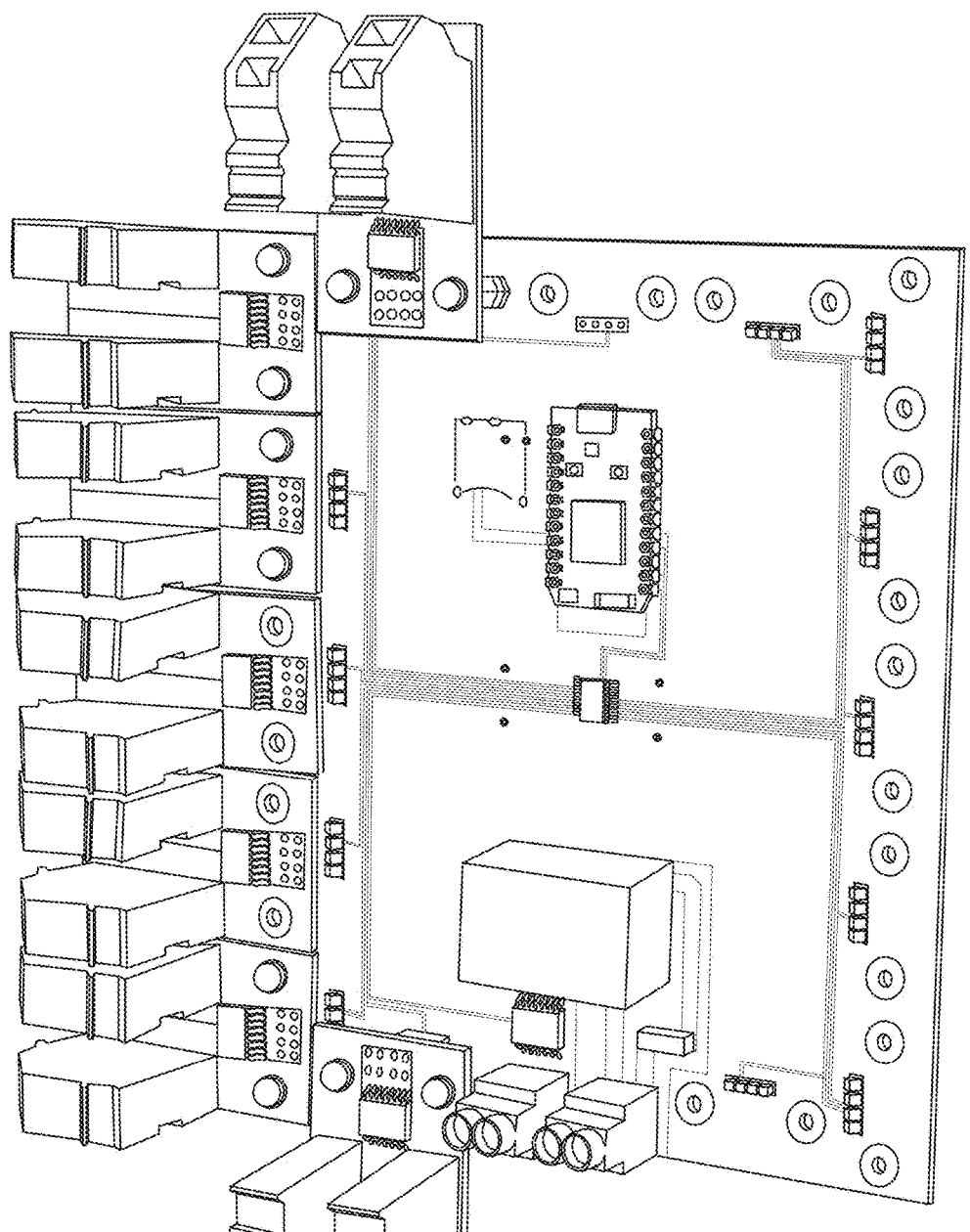
FIG. 10 is a perspective view of a partially deconstructed embodiment of a monitoring system, according to the inventive concepts disclosed herein.

Referring now to FIG. 8A, a top of a daughterboard unit 104-1 may have a sensor 110 attached thereto to monitor current flow through one or more additional current carriers 104. For example, FIG. 8B depicts a bottom view of an embodiment of a daughterboard unit 104-1 having two circuit breaker switches through which circuit breaker wire feeds may pass for the monitoring. It is noted that the top configuration of the sensor 110 on the daughterboard unit 104-1 is not limiting. For example, FIG. 10 depicts a bottom configuration of the sensor(s) 110, in which the sensor(s) 110 are attached to a bottom side with respect to a daughterboard unit 104-1.

It is further noted that other motherboard/daughterboard configurations or configurations of monitoring apparatuses 102 are contemplated herein. For example, referring now to FIGS. 9 and 10, a remote monitoring apparatus 102-1 may be communicatively coupled by way of channel 122-1 to the motherboard unit 104-1. For instance, the apparatus 102-1 may be an individual endpoint monitor with or without its own LED display, wirelessly coupled via WiFi to communicate the individual endpoint monitoring data to the motherboard unit 104-0.

In some embodiments, a motherboard unit 104-0 may be tailored to one or more circuits being monitored, such as a 30 or 60 Amp circuit. In other embodiments, the motherboard unit 104-0 may be tailored to a count of circuits or a type of circuit being monitored. For example, there may be a count of eight, 16, or 20 or more circuits within a circuit breaker box, and a contactless motherboard unit may be tailored to monitor each of the circuits within the box. By way of another example, the type of circuit may be a single or a triple phase circuit, and the motherboard unit 104-0, and/or a daughterboard unit 104-1, may be tailored to include sufficient monitoring apparatuses, inputs/outputs, sensing devices 110, etc. for either the single or the triple-phase configuration.

In embodiments, the sensing devices 110 are always on, allowing for a faster read cycle with less fluctuations in the data set because the sensors do not need to 'warm up'. It is noted that the power-on time (tpo) is proportional to the $V_{cc}$ and the $VI_{out}$ of a sensor 110, thus in some embodiments where high current flow is monitored, the time savings due to the absence of the 'warm up' may be significant.

Referring now to FIG. 10, an embodiment of a partially deconstructed motherboard unit 104-0 with multiple input sensing devices 110 is depicted. It is noted that the motherboard unit 104-0 is partially deconstructed at least with respect to one or more daughterboard units 104-1, mounting screws and/or standoffs, a female connector, and the second or external memory 132. For example, at least two of the daughterboard units 104-1 are depicted without mounting screws and/or standoffs. By way of another example, the female connector for a port, such as port 144 or a second port, may be a four-way connector on the far end, near the photon CPU/SD card, and may be configured to receive a USB cable in order to program the CPU.

Security

In embodiments, because the CPU 118 may be attached on or within a circuit breaker box 136, with individual daughterboard monitoring apparatuses 102 configured to monitor conductors within a circuit breaker socket, the CPU 118 may have sensitive information in need of protection. In other embodiments, the CPU 118 may be implemented in or between a home or residential level (e.g., socket level/layer) of monitoring and a server level of monitoring, receiving monitoring data transfers (e.g., group-wise monitoring data) from groups of monitoring apparatuses 102 and transmitting the monitoring data to a server for generating monitoring compilations. Thus, the data transfers may be even more sensitive, in the sense that more users are effected if compromised. In yet other embodiments, the CPU 118 may be monitoring individual voltage sensing devices 110 to a motherboard and/or a daughterboard, and may have a port (e.g., port 144) for accessing/updating the CPU 118 (e.g., firmware embedded or installed thereon). If the firmware is hacked or otherwise compromised, the monitoring apparatus 102 may function improperly or provide incorrect data transfers (e.g., sensor readings).

In some embodiments, in order to prevent the compromise of data, the website configured for presenting monitoring data and user interpretations, or the host server, may implement security protections. In some embodiments, other security protections may be implemented throughout one or all OSI abstraction layers. For example, the website hosted by a server may use a specific protocol (e.g., HTTP), the website may use a specific programming language (e.g., HTML, javascript, etc.), network devices may use another specific protocol (e.g., TCP/IP, serial-TCP/IP, etc.), the website or the host server may use one or more certificates to create a Secure Socket Layer (SSL), endpoint sockets (e.g., stream sockets, datagram sockets, raw sockets, etc.) may use their own protocols or communication properties that must be complied with, encrypted data transfers may be used between the monitoring apparatus 102 and the host server, encrypted data transfers may be used within a peer-to-peer (P2P) network (e.g., blockchain technology), or combinations thereof. In some embodiments, WiFi communications between apparatuses 102 or between an apparatus 102 and a server support Open, WEP, WAPI, WPA and WPA2-PSK WiFi security modes.

In some embodiments, the website hosted by the server (or a group of load-balanced servers) may have restricted access to further secure data transfers from a monitoring apparatus 102 or a group of monitoring apparatuses. For example, using login information (e.g., user ID, password, biometric security, facial recognition, or combinations thereof), a processor 118 of a server may be able to restrict access or grant access based on the user accessing the information on the server. For instance, if the server identifies the user as someone with limited rights, the user may only access monitoring data from a single monitoring apparatus 102; whereas, in other embodiments, the user may be recognized as an administrator or owner of an apartment complex, and may have additional rights to access information associated with a group of monitoring apparatuses 102 or multiple groups of monitoring apparatuses.

In some embodiments, the motherboard monitoring apparatus 102 may be physically locked (e.g., magnetically, biometrically, lock-and-key, random number generation and verification, or combinations thereof) within the circuit breaker junction box. Because each of the circuit breaker sockets are then locked physically, another (e.g., second or third) secure socket layer (SSL) is created.

In some embodiments, an electrical outlet or socket may use a monitoring apparatus 102 that has a body with protruding blades or prongs that insert into the outlet/socket between the appliance (e.g., current carrier 106) and the outlet/socket. Because these monitoring apparatuses 102 may or may not implement a display and may be monitoring an appliance that uses significant amounts of current flow (e.g., an oven), data transfers from the socket-type monitoring apparatus 102 may be encrypted (e.g., symmetric encryption or asymmetric key pairing), access to the apparatus 102 may be restricted (e.g., password protected, biometrically protected, only accessible through the website which may use password, encryption key, user ID, or facial recognition of a user/mobile device), data integrity ensured (e.g., through use of CRC), or combinations thereof. It is noted that this protection of individual sockets, or data protection (e.g., using a semaphore, cyclic redundancy (CRC) check together with an authentication message, or other means), may create another SSL.

Referring now to FIG. 8A-8B, an illustrative embodiment of a daughterboard monitoring apparatus 104-1 is depicted. In embodiments, the monitoring apparatus 104-1 includes an input sensing device 110 and a communicative coupling (e.g., channel 122) to the motherboard unit 104-0.

In some embodiments, a daughterboard unit 104-1 includes multiple (e.g., two or more) blades 148 to provide a current and/or voltage input (e.g., input 106) and for monitoring current flow through the daughterboard unit 104-1. In some embodiments, the multiple blades 148 are physically separated, having a space between, such that one or more wires or other conductors may pass through or between the blades 130. For example, the multiple blades 148a may be configured as interrupt modules such as circuit breaker switches. In some embodiments, the flow of current disrupts the magnetic field of Hall Effect sensors, generating the calculated or measured Hall voltage aH. In other embodiments, the blades 148 have no space between them, and have input/output ports for receiving the one or more wires/conductors and the magnetic field disruption occurs within the device 102-0 or blades 148. By way of another example, the multiple blades 148b may be socket prongs for insertion into an electrical outlet which provides the input (e.g., input 106) for a monitored current flow.

Temperature Effects

In embodiments, the temperature at which the monitoring apparatus 102 operates may be taken into account when generating the monitoring data. For example, the temperature may be determined by thermistor 146 and, then the total error of a sensor 110 may be determined and compensated for according to the following:

$$E_{TOT}(I_P) = \sqrt{E_{sens_{AVG}} + \left(\frac{100 \times V_O E_{AVG}}{Sens \times I_P}\right)} \quad (4)$$

where $E_{-SENS}$ and $V_{-OE}$ are the +/−3 sigma values for those error terms; and for TA=−40 to 150° C. and $V_{cc}$=5V, Sens=400 mV/A (where $I_{PR(min)} < I_P < I_{PR(max)}$), $E_{sens}$ (sensitivity error)=−2 to 2%+/−1% at TA=25 to 150° C. and −5.5 to 5.5%+/−4.5% at TA=−40 to 25° C., $I_{PR}$=−5 to 5 Amps, the offset voltage (VOE) may be from −15 to 15 mV+/−7 mV at IP=0 Amps and TA=25 to 150° C. and from −30 to 30 mV+/−13 mV at IP=0 Amps and TA=−40 to 25° C. For instance, the total output error ($E_{TOT}$) may be from −2.5 to 2.5%+/−1.5% at IP=$I_{PR(max)}$ and TA=25 to 150° C. and from −6 to 6%+/−4.5% at IP=$I_{PR(max)}$ and TA=−40 to 25° C. In this regard, a feedback controller may be used to mitigate, equalize, cancel out, or otherwise compensate for the computed error (e.g., $E_{TOT}$) according to the temperatures at which data transfers or sensor readings occur.

In other embodiments, it is known that a resistance of a conductive material may vary with temperature, thus, the compensation of temperature effects may include calculating the resistance of the conductive material based on the temperature at which a sensor reading occurred. For example, a relationship similar to the following may be used in temperature compensation:

$$R = R_{ref}$$

where R is a conductor resistance at a first temperature T, $R_{ref}$ is a conductor resistance at a second temperature $T_{ref}$, and a is a conductor temperature coefficient of resistance for the material. It is noted that other forms of temperature compensation known in the art, such as temperature effects with oil/gas circuit breakers, are intended to be encompassed herein.

Referring now to FIGS. 9-14 an exemplary embodiment of a method 200 according to the inventive concepts disclosed herein may include one or more of the following steps. For example, the method 200 may be a method for precise power conductor and current monitoring.

A step 202 may include receiving a first one or more inputs from a first monitoring device. For example, a monitoring device within a circuit breaker junction box may receive one or more inputs from sensors operatively coupled to individual devices, such as outlets, sockets, light switches, or circuit breaker switches. The sensors may be supplying values that indicate an amount of current flowing through the individual device.

A step 204 may include determining a logic configuration based on the first one or more inputs received. For example, the first one or more inputs may include initialization messages to join or to establish an ad-hoc network of monitoring devices. The logic configuration determined may include a bit pattern that includes a number of bits or bytes proportional to a count of monitoring devices within the network. In this regard, the count of monitoring devices may be based on the number of initialization messages received.

A step 206 may include sequentially receiving a second one or more inputs from one or more second monitoring devices that are communicatively coupled with the first monitoring device. In this regard, either the first monitoring device or one or more second monitoring devices are communicatively coupled (e.g., via wired or wireless Ethernet) to sensors that correlate a current flow with a specific voltage output (e.g., $VI_{out}$). The sensors may include a baseline or reference sensor to provide a baseline sensor reading. For example, the reference sensor may be coupled to a ground, such that current flowing through the ground is essentially zero, unless an overload condition is occurring. The reference sensor may enable an equalization of fluctuations, according to a difference calculated between a reading from the reference sensor and another sensor reading.

A step 208 may include providing a packet of monitoring data to a processor for data processing, analysis, and compilation. For example, a processor may include a DEMUX module to deconstruct a data stream of monitoring data, and organize the deconstructed data stream according to memory with addresses mapped to respective sensors. In this regard, packets may be sent to the processor and the processor may utilize the packets of monitoring data, analyze them, determine trends, and generate one or more monitoring compilations. The one or more monitoring compilations may be used to derive a useful data interpretation such as life span of a type of a current source monitored, a remaining life expectancy of the device, an efficiency associated with the device, and combinations thereof.

A step 210 may include presenting the monitoring data to a user on a display. For example, a user may access a website using HyperText Transfer Protocol (HTTP) and from a mobile device according to a password (e.g., encryption key, biometric security, facial recognition, secure socket layer (SSL) certificate or other identifying information, or combinations thereof). Once accessed, the website may associate a device/user ID (e.g., MAC address, IP Address, user login, domain name, or combinations thereof) with one or more monitoring apparatuses providing data to the host server. Based on the successful login, or receipt of authorizing information, the host server may provide information enabling the end user device to display the monitoring data, the monitoring data compilation, or a useful interpretation of such data.

In some embodiments, the method 200 may include one or more additional steps and/or subs-steps. For example, referring now to FIGS. 10 and 11, the method 200 may include steps/sub-steps 202-(1)-210-(1) and/or steps/sub-steps 202-(2)-210(2). In some embodiments, sub-steps 202-(1)-210-(1) may be associated with a second or a third tier or layer, while sub-steps 202-(2)-210-(2) may be associated with a first tier or layer of implementation.

A step/sub-step 202-(1) may include receiving multiple inputs from a group of monitoring devices. For example, the multiple inputs may include messages from one or more groups of monitoring devices, where each group may be a network of monitoring apparatuses. For instance, a network switch or bridge may be configured to receive the messages from each of one or more groups of monitoring apparatuses. The messages may be precursors to receipt of a packet from a group of the one or more groups of monitoring apparatuses.

A step/sub-step 204-(1) may include determining a bit pattern of a size proportional to a count of the multiple messages received. For example, the number of bits in the bit pattern may represent a number of different groups from which the network switch/bridge is receiving packets. In other embodiments, the bit pattern may represent a number of network switches/bridges providing data to a server. In some embodiments, the bit pattern may be used for port translation, or for transferring data (e.g., one or more packets) to one or more devices (e.g., servers) that use a single IP address.

A step/sub-step 206(1) may include receiving inputs from one or more network switches according to the bit pattern. For example, the reference or baseline sensor may be configured as a controller node, or gateway node, for an ad-hoc network. In this regard, the server may communicate through the controller node according to a multi-hop infrastructure, in order to conserve transmission power. In this regard, the controller node is the baseline or reference sensor as it determines what other terminals and/or nodes are within its network and how to communicate with those nodes and/or terminals (e.g., controller node may assign time slots for TDMA). In this regard, the inputs from the network switches may be time slot assignments/reassignments, initialization (e.g., join) messages for initializing or updating the network of the server, or combinations thereof.

A step/sub-step 208-(1) may include providing multiple packets of monitoring data to a server for data processing, analysis, compilation, pattern determination, and trend analysis. For example, the server may be the second controller, and may be tasked with generating one or more meaningful interpretations based on the monitoring data or based on data monitoring compilations.

A step/sub-step 210-(2) may include presenting a monitoring compilation or a result based on the monitoring compilation to a user on a display. For example, a monitoring compilation may include a data tree, with one or more nodes and one or more leaves, and a result of the monitoring compilation may include, but is not limited to, peak usage times, suggested energy efficiency tips (e.g., replace fridge or replace appliance associated with sensor #1), life expectancy of an appliance associated with a current carrier being monitored, or combinations thereof.

Figure 11:
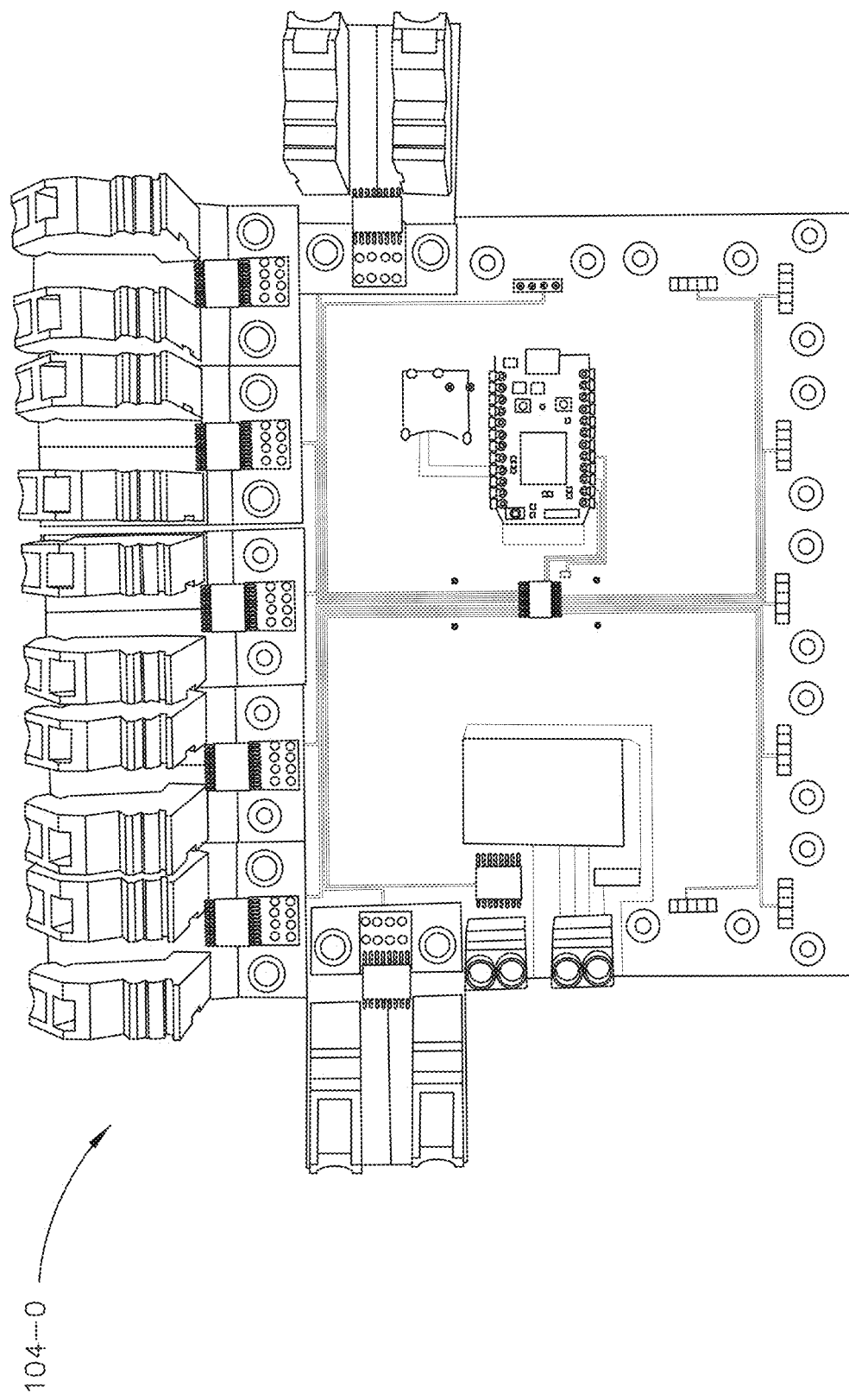
FIG. 11 is a top view of a partially deconstructed embodiment of a monitoring system, according to the inventive concepts disclosed herein.
Figure 12:
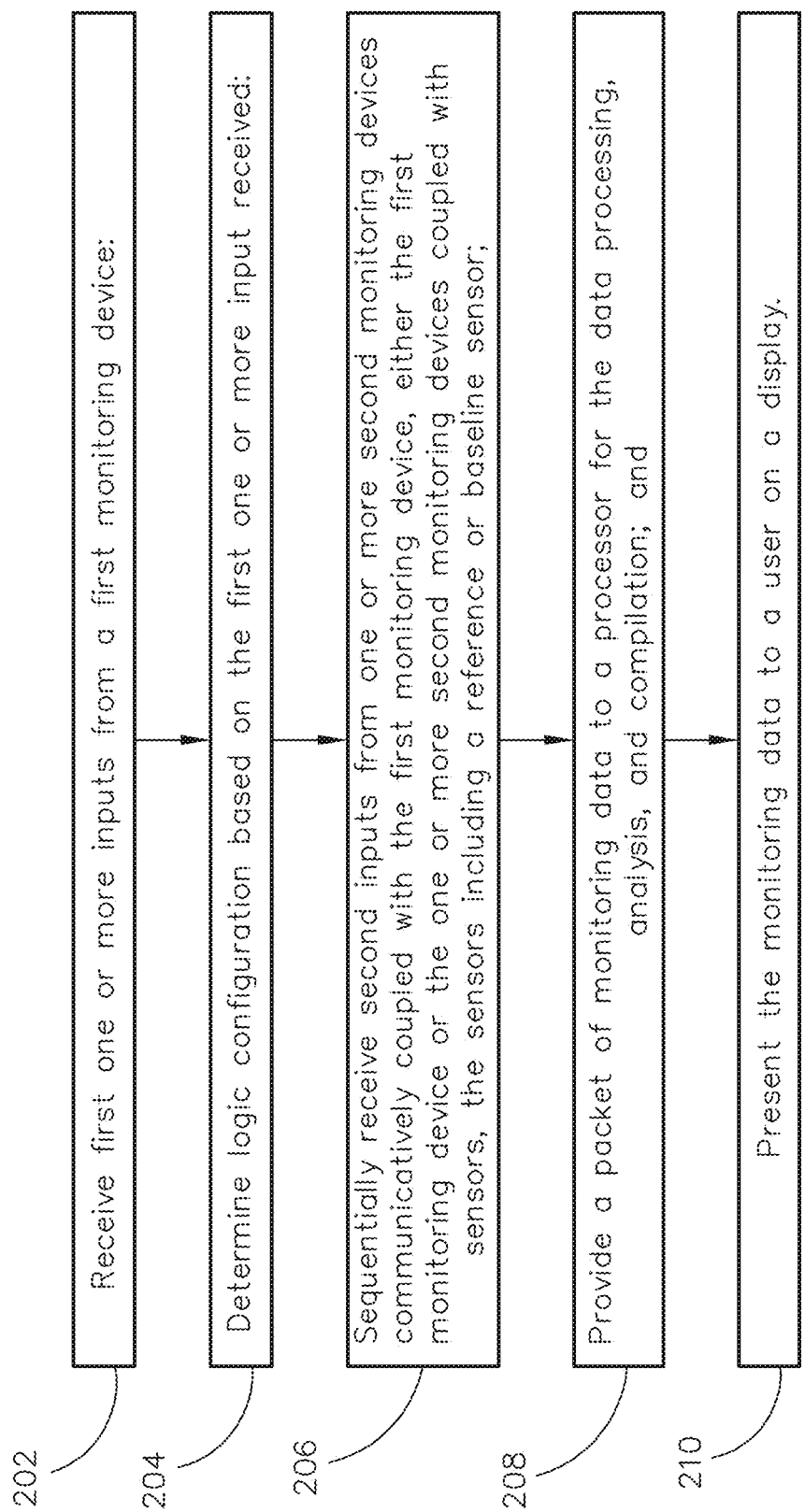
FIG. 12 is an embodiment of a method for precise current and conductor monitoring, according to the inventive concepts disclosed herein.
Figure 13:
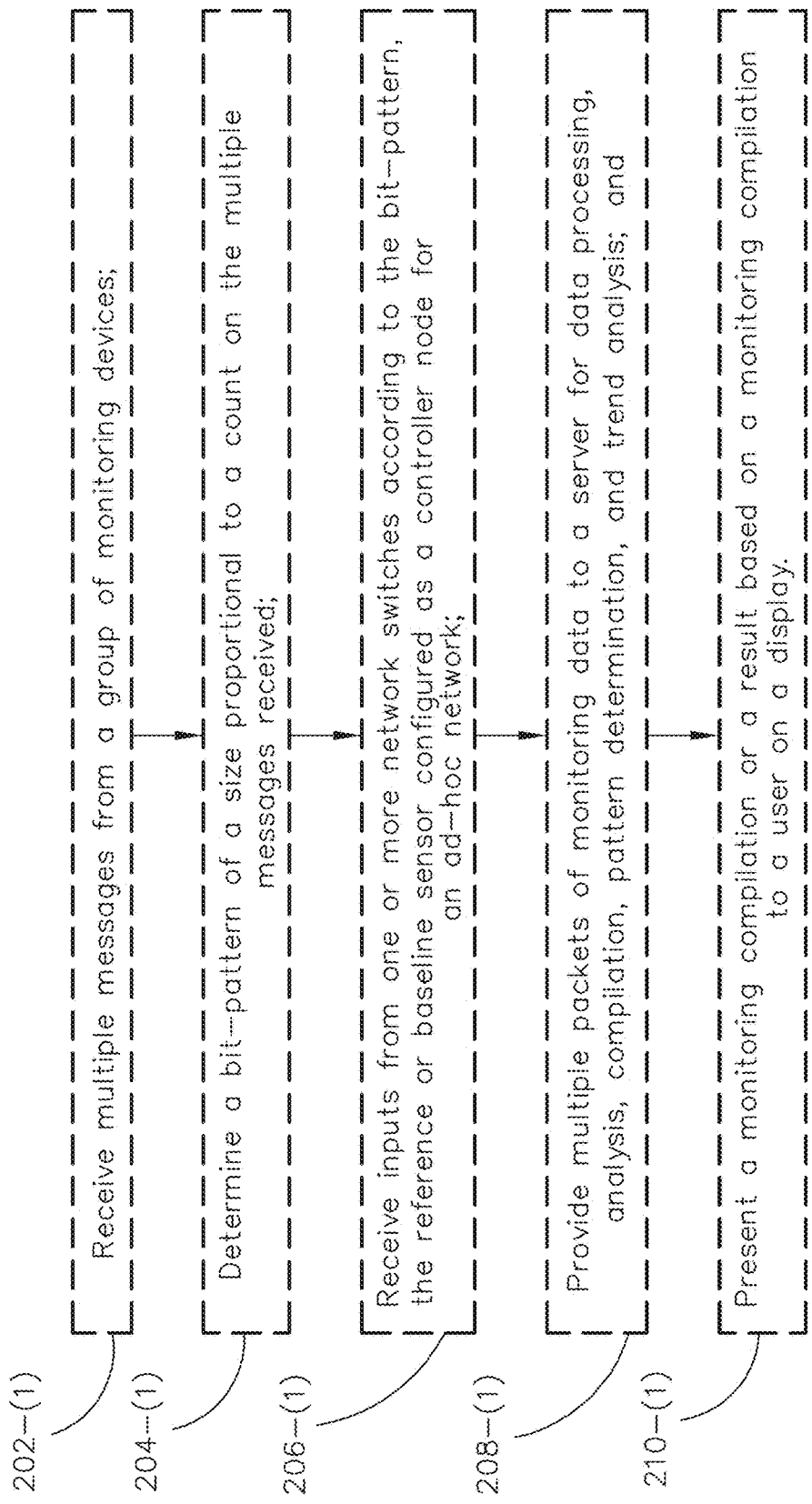
FIG. 13 is an embodiment of a method for scaled and precise current and conductor monitoring, according to the inventive concepts disclosed herein.
Figure 14:
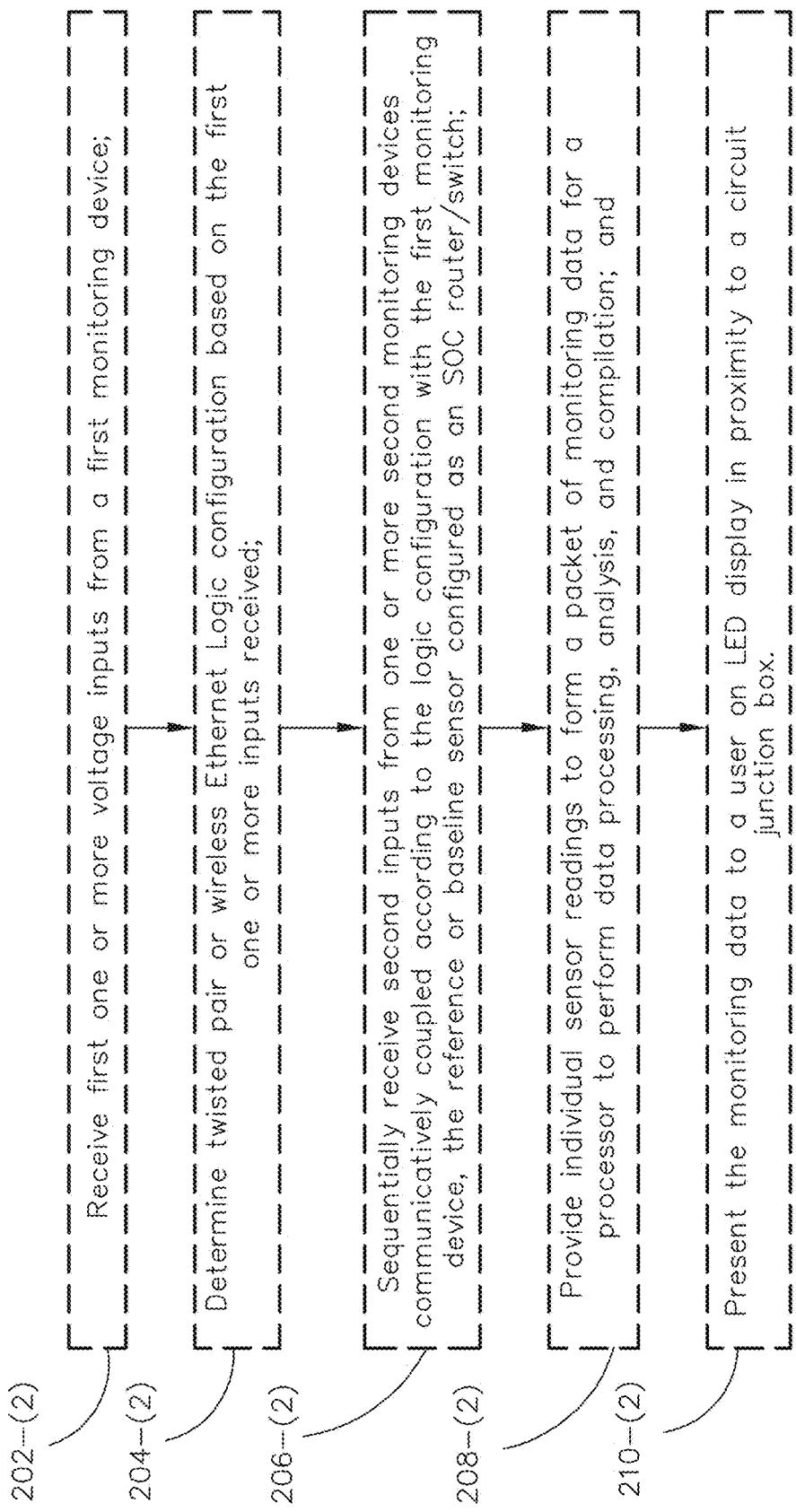
FIG. 14 is an embodiment of a method for precise current and conductor monitoring, according to the inventive concepts disclosed herein.

Referring now to FIG. 11, a step/sub-step 202-(2) may include receiving one or more voltage inputs from a first monitoring device. For example, the one or more voltage inputs may include digital signals from one or more logic signal generators or digital pattern generators. For instance, SOC router/switch may be configured to receive the digital signals from the logic signal generator or the digital pattern generator, where a digital signal may represent a 5V+ input value.

A step/sub-step 204-(2) may include determining a twisted pair or wireless Ethernet logic configuration based on the first inputs received. For example, the number of bits in the bit pattern may represent a number of digital signal inputs from which the SOC router/switch is receiving sensor monitoring information.

A step/sub-step 206(2) may include sequentially receiving second inputs from second one or more monitoring devices communicatively coupled to the SOC switch/router according to the logic configuration or bit pattern.

A step/sub-step 208-(2) may include providing individual sensor readings to form a packet of monitoring data for a processor to perform data processing, analysis, and compilation. For example, the SOC router/switch, or a processor in communication with the SOC router/switch, may be the first controller, and may have one or more machine learning algorithms thereon such that it may be tasked with data mining and other machine learning processes.

A step/sub-step 210-(2) may include presenting the monitoring data to a user on a display. For example, a monitoring data may include an overall energy usage associated with a single circuit, or multiple circuits, and the display may include a light emitting diode (LED) display attached, or in close proximity to, the circuit breaker junction box.

Referring now to FIG. 15 an exemplary embodiment of a method 300 according to the inventive concepts disclosed herein may include one or more of the following steps. For example, the method 300 may be a method for scaled and precise power conductor and current monitoring.

A step 302 may include receiving, at a CPU, multiple inputs from multiple input sensing devices through a switching module and processing the multiple inputs. In embodiments, the multiple input sensing devices are communicatively coupled with multiple, individual current carriers.

A step 304 may include determining, using the CPU and the multiple inputs, amounts of one or more respective electrical current flows as one or more digital values using a voltage output from a sensor (e.g., Hall Effect sensor) of the multiple input sensing devices as a first input to the CPU. In this regard, the voltage output may be proportional to an analog amount of current flow through a current carrier of the multiple current carriers.

A step 306 may include compensating temperature effects in determining the one or more digital values using the CPU and a second input from the thermistor.

A step 308 may include monitoring the one or more digital values and the one or more respective current flows to trigger an intentional interrupt in the interrupt module when the one or more digital values or the one or more respective current flows exceed a predetermined threshold.

A step 310 may include determining an electrical energy usage based on the one or more respective current flows and the one or more digital values.

A step 312 may include transmitting or presenting the electrical energy usage on a display. For example, monitoring data may be transmitted from the CPU to a server which configures the monitoring data for presentation or access on a user mobile device (e.g., tablet, smart phone, laptop computer, etc.).

It is noted that components may be separated or included together as components of a kit. For example, a motherboard unit may be packaged together with one or more daughterboard units as a kit, wherein the number of daughterboard units in the kit may be based on a user electrical grid or circuit configuration. It is further noted that the kit, the components, or the monitoring may be tied together with blockchain technology. For example, a kit may be purchased using bitcoin, and monthly electrical energy usage, such as total usage, may be paid for using bitcoin. In other embodiments, incentives may be offered using blockchain. For example, a bitcoin wallet/hive may be added to if total electrical energy usage is below a threshold amount for the month, year, or other time-frame.

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed is:

1. A current monitor system, comprising:
    a plurality of input sensing devices coupled to a plurality of current carriers to monitor one or more respective current flows of one or more individual current carriers of the plurality of current carriers, a first input sensing device of the plurality of input sensing devices comprising a Hall Effect sensor, a second input sensing device comprising a thermistor, a third input sensing device comprising an interrupt module, and a fourth input sensing device comprising a switching module;
    a first processor communicatively coupled with the plurality of input sensing devices to continuously receive a plurality of inputs;
    a memory coupled to the first processor and including executable instructions configured to perform steps, comprising:

receiving the plurality of inputs from the plurality of input sensing devices, at least a first input from the Hall Effect sensor being through the switching module;

determining, using the plurality of inputs, the one or more respective current flows as one or more digital values using a voltage output from the Hall Effect sensor as the first input to the first processor, the voltage output being proportional to an analog amount of current flow through the one or more individual current carriers of the plurality of current carriers;

compensating temperature effects in determining the one or more digital values using a second input from the thermistor;

triggering an intentional interrupt in the interrupt module when the one or more respective current flows or the one or more digital values exceed a predetermined threshold;

determining an electrical energy usage based on the one or more respective current flows and the one or more digital values; and presenting, using a second processor and a display, a user interpretation based on the electrical energy usage.

2. The system of claim 1, wherein the first processor comprises a central processing unit (CPU) and the second processor comprises a host server, the host server configured to present the user interpretation on a host website.

3. The system of claim 1, further comprising a user mobile device, wherein the second processor comprises a host server configured to use a Hyper Text Transfer Protocol (HTTP) and a secure socket layer (SSL) to present the user interpretation on the display of the user mobile device.

4. The system of claim 1, wherein the plurality input sensing devices comprises a plurality of Hall Effect sensors operatively coupled to monitor each current carrier of each circuit breaker switch of a circuit breaker junction box.

5. The system of claim 1, wherein the switching module comprises switching logic that uses a single-bit input to switch between receiving a first sensor input from a first input sensing device and receiving a second sensor input from a second input sensing device.

6. The system of claim 5, wherein the switching logic comprises first logic circuitry controlled by the first processor, and the first processor is controllably coupled with second logic circuitry, the second logic circuitry being configured to map a binary set of values to a decimal-based number, the decimal based number comprising at least one of i) a first identification (ID) number associated with a communication channel used to communicatively couple the first or the second sensor input to the first processor, and ii) a second ID number associated with a respective input sensing device of the plurality of input sensing devices.

7. The system of claim 1, further comprising a power supply, wherein the first processor, the power supply, the Hall Effect sensor, the interrupt module, and the switching module are operatively attached to a motherboard unit.

8. The system of claim 7, wherein the Hall Effect sensor comprises a first Hall Effect sensor, and the system further comprises at least a second Hall Effect sensor attached to a daughterboard unit, the daughterboard unit being communicatively coupled with the motherboard unit to provide monitoring data from a respective current carrier being monitored by the second Hall Effect sensor to the first processor attached to the motherboard unit.

9. The system of claim 1, wherein a first current carrier of the plurality of current carriers is located on or within a circuit breaker junction box, and a second current carrier is located remotely with respect to the first processor and the circuit breaker junction box, and wherein the communicative coupling of the first processor and the second current carrier includes at least one of: wireless WiFi coupling, wireless Ethernet coupling, one-wire Ethernet coupling, and two-wire Ethernet coupling.

10. A current monitor apparatus, comprising:

a plurality of input sensing devices attached to a first current carrier of a plurality of current carriers to monitor respective current flows of the plurality of current carriers, a first input sensing device comprising a Hall Effect sensor, a second input sensing device comprising a thermistor, a third input sensing device comprising an interrupt module, and a fourth input sensing device comprising a switching module;

a central processing unit (CPU) communicatively coupled with the plurality of input sensing devices to continuously receive a plurality of inputs;

a memory coupled to the CPU and including executable instructions configured to perform steps, comprising:

receiving at least a portion of the plurality of inputs from the plurality of input sensing devices through the switching module and processing the plurality of inputs, the portion of the plurality of inputs being associated with the Hall Effect sensor;

determining, using the CPU and the plurality of inputs, the one or more respective current flows as one or more digital values using a voltage output from the Hall Effect sensor as a first input to the CPU, the voltage output being proportional to an analog amount of current flow through the first current carrier or a second current carrier of the plurality of current carriers;

compensating temperature effects in determining the one or more digital values using a second input from the thermistor;

triggering an intentional interrupt in the interrupt module when the one or more respective current flows or the one or more digital values exceed a predetermined threshold;

determining an electrical energy usage based on the one or more digital values; and displaying the electrical energy usage or transmitting the electrical energy usage for presentation on a display.

11. The apparatus of claim 10, wherein first current carrier comprises a printed circuit board (PCB) material configured as a motherboard or a component thereof, the Hall Effect sensor comprises a first Hall Effect sensor, and the motherboard includes a plurality of channels for electrically or communicatively coupling at least a second Hall Effect sensor to the motherboard.

12. The apparatus of claim 11, wherein the first Hall Effect sensor is configured to monitor a first current flow from an input of the first current carrier and a second current flow to a ground of the first current carrier, and the second Hall Effect sensor electrically or communicatively coupled to the motherboard is attached to a daughterboard to monitor a third current flow and a fourth current flow through a plurality of separate blades.

13. The apparatus of claim 12, wherein the plurality of separate blades comprises at least two circuit breaker switches configured to receive respectively the third current flow or the fourth current flow and cause an intentional interrupt when either the third current flow or the fourth current flow exceeds a predetermined threshold, and the second current carrier comprises a hardwire circuit breaker switch input.

14. The apparatus of claim 12, wherein the first Hall Effect sensor is configured to provide a baseline reading to the CPU for use in compensating fluctuations that exist in sensor readings from the second Hall Effect sensor.

15. The apparatus of claim 10, further comprising a variable resistor and a bidirectional port, the bidirectional port configured for a type of USB coupler and the variable resistor configured to provide an input voltage to an input sensing device of the plurality of input sensing devices based on an amperage of the first current carrier or the second current carrier.

16. A method of current monitoring, comprising:
receiving, at a central processing unit (CPU), a plurality of inputs from a plurality of input sensing devices and processing the plurality of inputs, the plurality input sensing devices comprising at least a Hall Effect sensor, a thermistor, an interrupt module, and a switching module, the plurality of input sensing devices being communicatively coupled with a plurality of current carriers, wherein at least the input from the Hall Effect sensor is through the switching module;
determining, using the CPU and the plurality of inputs, amounts of one or more respective electrical current flows as one or more digital values using a voltage output from the Hall Effect sensor as a first input to the CPU, the voltage output being proportional to an analog amount of current flow through a current carrier of the plurality of current carriers;
compensating temperature effects in determining the one or more digital values using the CPU and a second input from the thermistor;
monitoring the one or more digital values and the one or more respective current flows to trigger an intentional interrupt in the interrupt module when the one or more digital values or the one or more respective current flows exceed a predetermined threshold;
determining an electrical energy usage based on the one or more respective current flows and the one or more digital values; and
transmitting or presenting the electrical energy usage on a display.

17. The method of claim 16, wherein determining, using the CPU and the plurality of inputs, amounts of one or more respective electrical current flows as one or more digital values using a voltage output from the Hall Effect sensor as a first input to the CPU comprises correlating the voltage output from the Hall Effect sensor with a second voltage output from a second Hall Effect sensor, the second Hall Effect sensor comprising a baseline or reference sensor.

18. The method of claim 16, wherein the Hall Effect sensor comprises a first Hall Effect sensor, and the plurality of input sensing devices comprises the first Hall Effect sensor and at least a second Hall Effect sensor, and receiving, at a CPU, a plurality of inputs from a plurality of input sensing devices and processing the plurality of inputs comprises continuously receiving a portion of the plurality of inputs from the first Hall Effect sensor and the at least a second Hall Effect sensor through the switching module; and
wherein the switching module communicatively couples the first Hall Effect sensor with the CPU to provide first monitoring data, and the switching module communicatively couples the second Hall Effect sensor with the CPU to provide second monitoring data to the CPU upon receiving a single-bit input.

19. The method of claim 16, wherein monitoring the one or more digital values and the one or more respective current flows to trigger an intentional interrupt in the interrupt module when the one or more digital values or the one or more respective current flows exceed a predetermined threshold comprises using a remote relay switch communicatively coupled with a server and a user mobile device to control the intentional interrupt.

20. The method of claim 16, wherein processing the plurality of inputs by the CPU comprises at least buffering the plurality of inputs and formatting the plurality of inputs, and
wherein transmitting or presenting the electrical energy usage on a display comprises presenting on an HTTP website controlled by a host server one or more user interpretations, the one or more user interpretations comprising at least one of: a status of a circuit, an electrical capacity of the circuit, a type or name associated with the circuit, a type of user associated with the circuit, a type or name associated with an appliance on the circuit, a remaining life span of the appliance, a replacement date of the appliance, an operational capacity of the appliance, a status of an electrical load on the circuit, a balance of the electrical load, and a type or name of one or more devices associated with the electrical load.

\* \* \* \* \*